United States Patent
Takatori

(10) Patent No.: US 8,072,824 B2
(45) Date of Patent: Dec. 6, 2011

(54) OPERATION GUARANTEE SYSTEM

(75) Inventor: Masahiro Takatori, Osaka (JP)

(73) Assignee: Panasonic Corporation, Osaka (JP)

( * ) Notice: Subject to any disclaimer, the term of this patent is extended or adjusted under 35 U.S.C. 154(b) by 100 days.

(21) Appl. No.: 12/668,336

(22) PCT Filed: Jun. 27, 2008

(86) PCT No.: PCT/JP2008/001686
§ 371 (c)(1),
(2), (4) Date: Jan. 8, 2010

(87) PCT Pub. No.: WO2009/008130
PCT Pub. Date: Jan. 15, 2009

(65) Prior Publication Data
US 2010/0182854 A1     Jul. 22, 2010

(30) Foreign Application Priority Data
Jul. 12, 2007 (JP) .............................. 2007-183667

(51) Int. Cl.
*G11C 7/00* (2006.01)

(52) U.S. Cl. .............. 365/191; 365/223.1; 365/233.11; 365/193

(58) Field of Classification Search .............. 365/191, 365/193, 233.1, 233.11
See application file for complete search history.

(56) References Cited

U.S. PATENT DOCUMENTS

| | | | |
|---|---|---|---|
| 6,370,067 B1 | 4/2002 | Ko et al. | |
| 2001/0056521 A1 | 12/2001 | Fujiwara et al. | |
| 2002/0188899 A1 | 12/2002 | Yamazaki | |
| 2003/0231042 A1 | 12/2003 | Lin et al. | |
| 2005/0135167 A1 | 6/2005 | Manabe | |
| 2005/0242850 A1 | 11/2005 | Kawasaki | |
| 2005/0264331 A1 | 12/2005 | Lin et al. | |
| 2006/0140045 A1 | 6/2006 | Kishimoto et al. | |
| 2007/0291555 A1 | 12/2007 | Kishimoto et al. | |
| 2008/0291749 A1 | 11/2008 | Kishimoto et al. | |

FOREIGN PATENT DOCUMENTS

| | | |
|---|---|---|
| JP | 8-110872 | 4/1996 |
| JP | 8-137783 | 5/1996 |
| JP | 2001-160000 | 6/2001 |
| JP | 2001-290697 | 10/2001 |

(Continued)

OTHER PUBLICATIONS

English language Abstract of JP 8-110872, Apr. 30, 1996.

(Continued)

*Primary Examiner* — Amir Zarabian
*Assistant Examiner* — Kretelia Graham
(74) *Attorney, Agent, or Firm* — Greenblum & Bernstein, P.L.C.

(57) ABSTRACT

An operation guarantee system includes a decoder circuit, a comparison circuit, a CPU circuit, a frequency adjustment circuit and a DQ adjustment circuit. The comparison circuit compares a test data signal input from the decoder circuit with an expected value data signal input from the exterior, and detects the presence or absence of an output error in the decoder circuit. The CPU circuit controls the frequency adjustment circuit and the DQ adjustment circuit to vary a frequency of a clock signal input to an external memory and a delay amount of the data signal. In addition, the CPU circuit acquires a result of detection of the comparison circuit under various conditions. Then, the CPU circuit determines an appropriate frequency of the clock signal input to the external memory based on a relationship between the various conditions and the presence or absence of the output error.

6 Claims, 19 Drawing Sheets

| | FOREIGN PATENT DOCUMENTS | | JP | 2006-338130 | 12/2006 |
|---|---|---|---|---|---|
| JP | 2002-366421 | 12/2002 | | | |
| JP | 2005-141725 | 6/2005 | | OTHER PUBLICATIONS | |
| JP | 2005-530297 | 10/2005 | English language Abstract of JP 8-137783, May 31, 1996. | | |
| JP | 2006-107352 | 4/2006 | English language Abstract of JP 2006-338130, Dec. 14, 2006. | | |
| JP | 2006-189916 | 7/2006 | English language Abstract of JP 2001-160000, Jun. 12, 2001. | | |

OPERATION GUARANTEE SYSTEM

TECHNICAL FIELD

The present invention relates to an operation guarantee system that guarantees an operation of a system board and or the like.

BACKGROUND ART

In multifunctional and high-performance electronic apparatuses, a large number of digital signals need to be processed at high speed, and therefore highly integrated system LSIs (Large Scale Integrated Circuits) are mounted. In recent years, there have been developed various memories such as a DDR-SDRAM (Double Data Rate Synchronous Dynamic Random Access Memory) with high processing speed that are applicable to such highly integrated system LSIs.

In the electronic apparatuses or the like, the system LSI and the memory are electrically connected to each other on a common board. Hereinafter, the board on which the system LSI and the memory are mounted is referred to as a system board.

Writing data from the system LSI in the memory and reading data from the memory to the system LSI are executed in synchronization with a clock signal. While the data and the clock signal are transmitted through conductor patterns within the system board, a time lag may occur between the data and the clock signal due to various causes. In the foregoing memory that processes a large number of signals at high speed, such a time lag between the data and the clock signal may be a major cause of error occurrences. Therefore, a method for preventing such error occurrences of the memory has conventionally been proposed.

For example, the clock signal and a plurality of delay clock signals (signals obtained by delaying the clock signal) are generated in a memory access circuit described in Patent Document 1. In the memory access circuit, test data is written in the memory in synchronization with the clock signal, and test data is read from the memory in synchronization with the plurality of delay clock signals, respectively. The data written in the memory and the data read from the memory are compared with one another, and an optimum delay value of the clock signal is determined from the result of comparison. This prevents an occurrence of the error in reading the data from the memory.

[Patent Document 1] JP 2005-141725 A

DISCLOSURE OF THE INVENTION

Problems to be Solved by the Invention

The delay value of the clock signal with respect to the memory can be determined according to a use environment of the electronic apparatus in the foregoing method; however, the occurrence of the error in the system board may not be prevented in a certain use environment even though the delay value of the clock signal is adjusted. That is, the operation of the system board cannot be appropriately guaranteed by the foregoing method.

An object of the present invention is to provide an operation guarantee system capable of appropriately guaranteeing an operation.

Means for Solving the Problems (1) According to an aspect of the present invention, an operation guarantee system includes a signal processing circuit that processes a signal, a first storage circuit that is operated based on first and second operating conditions and stores a data signal output from the signal processing circuit at the time of signal processing in the signal processing circuit, an adjustment circuit that adjusts the first operating condition of the first storage circuit to different values, and adjusts the second operating condition of the first storage circuit to different values for each value of the first operating condition, a detection circuit that detects the presence or absence of an output error in the signal processing circuit, a determiner that determines a range of variation of the value of the second operating condition in a state where the output error is not detected from the detection circuit as a first allowed range of variation for each value of the first operating condition adjusted by the adjustment circuit, and determines whether or not the first allowed range of variation is a first threshold value or more for each value of the first operating condition, and a second storage circuit that stores at least one value out of the values of the first operating condition with which the first allowed range of variation is determined to be the first threshold value or more by the determiner.

In the operation guarantee system, the data signal output from the signal processing circuit is stored in the first storage circuit at the time of the signal processing in the signal processing circuit. The adjustment circuit adjusts the first operating condition of the first storage circuit to the different values, and varies the second operating condition to the different values for each value of the first operating condition. The presence or absence of the output error in the signal processing circuit during the process of the variation is detected by the detection circuit.

The determiner determines the range of variation of the value of the second operating condition in the state where the output error is not detected by the detection circuit as the first allowed range of variation for each value of the first operating condition adjusted by the adjustment circuit, and determines whether or not the first allowed range of variation is the first threshold value or more for each value of the first operating condition. The at least one value out of the values of the first operating condition with which the first allowed range of variation is determined to be the first threshold value or more by the determiner is stored in the second storage circuit.

In this case, the occurrence of the output error in the signal processing circuit can be prevented by operating the first storage circuit based on the value of the first operating condition stored in the second storage circuit even though the value of the second operating condition varies in the range within the first threshold value. Accordingly, the first threshold value is set to an appropriate value to determine the value of the first operating condition with which an appropriate operation margin of the first storage circuit and the signal processing circuit can be obtained. As a result, the operations of the first storage circuit and the signal processing circuit can be appropriately guaranteed.

In addition, when the operation guarantee system is applied to the system board, the value of the first operating condition appropriate for the system board can be recognized based on the value of the first operating condition stored in the second storage circuit. This allows the system board to be appropriately selected according to a use environment and so on of an electronic apparatus in which the system board is to be used, so that the operation of the electronic apparatus can be appropriately guaranteed.

(2) The at least one value may be a highest value. In this case, the operation margins of the first storage circuit and the signal processing circuit can be sufficiently ensured while performance of the first storage circuit and the signal processing circuit can be improved by operating the first storage circuit based on the value stored in the second storage circuit.

(3) The operation guarantee system may further include an auxiliary circuit that outputs a clock signal to the first storage circuit and performs processing for writing and reading the data signal between the signal processing circuit and the first storage circuit, wherein the first operating condition may include a frequency of the clock signal.

In this case, the occurrence of the output error in the signal processing circuit can be prevented by operating the first storage circuit based on a clock frequency stored in the second storage circuit even though the value of the second operating condition varies in the range within the first threshold value. The first threshold value is set to the appropriate value to determine the clock frequency at which the appropriate operation margins of the first storage circuit and the signal processing circuit can be obtained. As a result, the operations of the first storage circuit and the signal processing circuit can be appropriately guaranteed.

In addition, when the operation guarantee system is applied to the system board, the value of the clock frequency appropriate for the system board can be recognized based on the value of the clock frequency stored in the second storage circuit. This allows the system board to be appropriately selected according to a use environment and so on of an electronic apparatus in which the system board is to be used, so that the operation of the electronic apparatus can be appropriately guaranteed.

(4) The auxiliary circuit may output to the first storage circuit a first reference signal as a reference of an acquisition timing of the data signal in the first storage circuit, and the second operating condition may include a first delay amount between the data signal input to the first storage circuit and the first reference signal.

In this case, the occurrence of the output error in the signal processing circuit can be sufficiently prevented by operating the first storage circuit based on the clock frequency stored in the second storage circuit even though the first delay amount varies because of various causes.

(5) The first storage circuit may output to the auxiliary circuit the data signal and a second reference signal as a reference of an acquisition timing of the data signal in the auxiliary circuit, and the second operating condition may include a second delay amount between the data signal input to the auxiliary circuit and the second reference signal.

In this case, the occurrence of the output error in the signal processing circuit can be sufficiently prevented by operating the first storage circuit based on the clock frequency stored in the second storage circuit even though the second delay amount varies because of various causes.

(6) The operation guarantee system may further include a drive voltage supply circuit that supplies a drive voltage to the first storage circuit, wherein the second operating condition may include the drive voltage.

In this case, the occurrence of the output error in the signal processing circuit can be sufficiently prevented by operating the first storage circuit based on the clock frequency stored in the second storage circuit even though the drive voltage varies because of various causes.

(7) The first storage circuit may be further operated based on a third operating condition, the adjustment circuit may adjust the third operating condition to different values for each value of the first operating condition, and adjusts the second operating condition of the first storage circuit to different values for each value of the third operating condition, the determiner may determine the first allowed range of variation for each value of the third operating condition adjusted by the adjustment circuit, determine a range of variation of the value of the third operating condition in a state where the first allowed range of variation is the first threshold value or more as a second allowed range of variation for each value of the first operating condition adjusted by the adjustment circuit, and determine whether or not the second allowed range of variation is a second threshold value or more for each value of the first operating condition adjusted by the adjustment circuit, and the second storage circuit may not store the value of the first operating condition with which the second allowed range of variation is not determined to be the second threshold value or more by the determiner.

In the operation guarantee system, the adjustment circuit adjusts the third operating condition to the different values for each value of the first operating condition while varying the second operating condition to the different values for each value of the third operating condition.

The determiner determines the first allowed range of variation for each value of the third operating condition adjusted by the adjustment circuit, and determines the range of variation of the value of the third operating condition in the state where the first allowed range of variation is the first threshold value or more as the second allowed range of variation. Furthermore, the determiner determines whether or not the second allowed range of variation is the second threshold value or more for each value of the first operating condition adjusted by the adjustment circuit.

Here, the values of the first operating condition determined to be less than the second threshold value by the determiner are not stored in the second storage circuit in the operation guarantee system.

In this case, the occurrence of the output error in the signal processing circuit can be prevented by operating the first storage circuit based on the value of the first operating condition stored in the second storage circuit even though the value of the third operating condition varies. Accordingly, the first and second threshold values are set to the appropriate values to determine the value of the first operating condition with which more appropriate operation margins of the first storage circuit and the signal processing circuit can be obtained. As a result, the operations of the first storage circuit and the signal processing circuit can be more appropriately guaranteed.

(8) The operation guarantee system may further include an auxiliary circuit that outputs a clock signal to the first storage circuit and performs processing for writing and reading the data signal between the signal processing circuit and the first storage circuit, wherein the first operating condition may include a frequency of the clock signal.

In this case, the occurrence of the output error in the signal processing circuit can be prevented by operating the first storage circuit based on the clock frequency stored in the second storage circuit even though the value of the third operating condition varies. Accordingly, the first threshold value is set to the appropriate value to determine the clock frequency at which more appropriate operation margins of the first storage circuit and the signal processing circuit can be obtained. As a result, the operations of the first storage circuit and the signal processing circuit can be more appropriately guaranteed.

(9) The operation guarantee system may further include a drive voltage supply circuit that supplies a drive voltage to the first storage circuit, wherein the auxiliary circuit outputs to the first storage circuit a first reference signal as a reference of an acquisition timing of the data signal in the first storage circuit, the second operating condition may include the drive voltage, and the third operating condition may include a first delay amount between the data signal input to the first storage circuit and the first reference signal.

In this case, the occurrence of the output error in the signal processing circuit can be sufficiently prevented by operating the first storage circuit based on the clock frequency stored in the second storage circuit even though the drive voltage and the first delay amount vary because of various causes.

(10) The operation guarantee system may further include, when the second allowed range of variation is determined to be the second threshold value or more by the determiner, a third storage circuit that stores an intermediate value between a maximum value and a minimum value of the drive voltage in the first delay amount with which the first allowed range of variation is maximized.

In this case, the output error in the signal processing circuit can be more reliably prevented by operating the first storage circuit based on the value of the drive voltage stored in the third storage circuit.

(11) The first storage circuit may output to the auxiliary circuit a second reference signal as a reference of an acquisition timing of the data signal in the auxiliary circuit, and the third operating condition may include a second delay amount between the data signal input to the auxiliary circuit and the second reference signal.

In this case, the occurrence of the output error in the signal processing circuit can be sufficiently prevented by operating the first storage circuit based on the clock frequency stored in the second storage circuit even though the second delay amount varies because of various causes.

EFFECTS OF THE INVENTION

According to the present invention, the occurrence of the output error in the signal processing circuit can be prevented by operating the first storage circuit based on the value of the first operating condition stored in the second storage circuit even though the value of the second operating condition varies in the range within the first threshold value. Accordingly, the first threshold value is set to the appropriate value to determine the value of the first operating condition with which the appropriate operation margins of the first storage circuit and the signal processing circuit can be obtained. As a result, the operations of the first storage circuit and the signal processing circuit can be appropriately guaranteed.

In addition, when the operation guarantee system is applied to the system board, the value of the first operating condition appropriate for the system board can be recognized based on the value of the first operating condition stored in the second storage circuit. This allows the system board to be appropriately selected according to the use environment and so on of the electronic apparatus in which the system board is to be used, so that the operation of the electronic apparatus can be appropriately guaranteed.

BEST MODE FOR CARRYING OUT THE INVENTION

Figure 1:
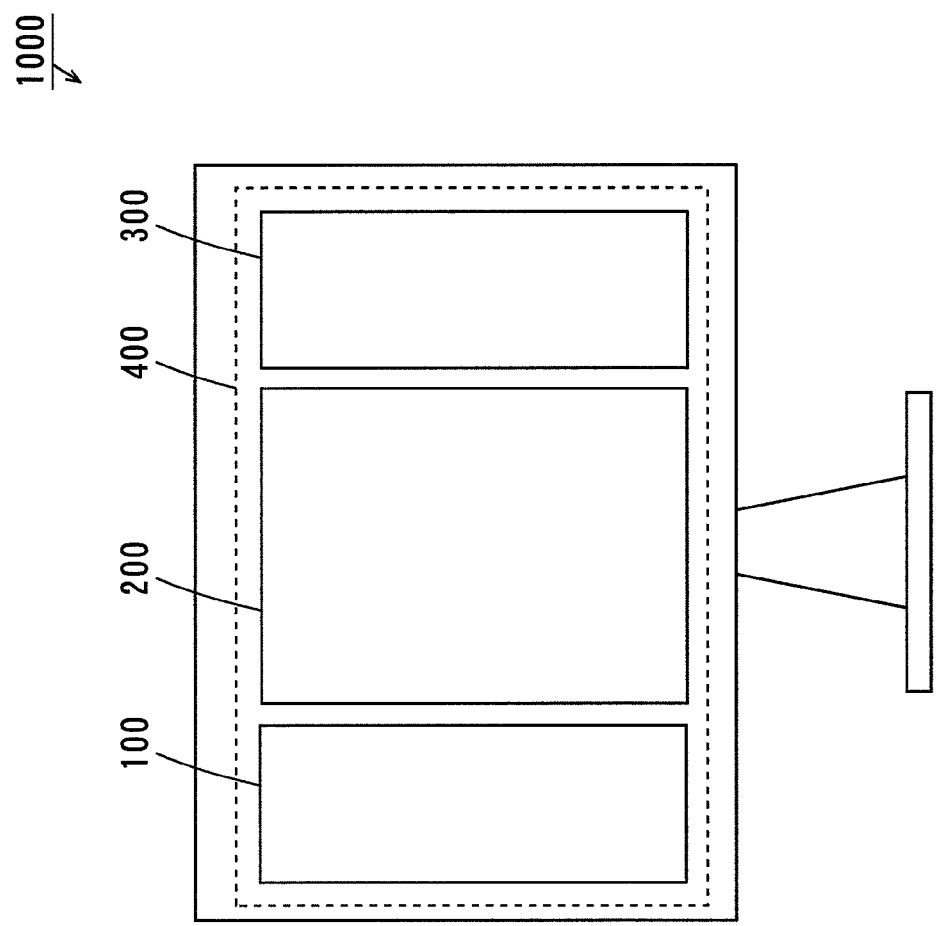
FIG. 1 is a schematic rear view showing a television receiver including an operation guarantee system according to an embodiment of the present invention.

Description will be made of an operation guarantee system according to embodiments of the present invention by referring to the drawings. Note that a television receiver including the operation guarantee system will be described in the following paragraphs.

(1) Configuration of Television Receiver

FIG. 1 is a schematic rear view showing a television receiver including an operation guarantee system according to an embodiment of the present invention.

As shown in FIG. 1, a power supply unit 100, a system board 200 and a display drive unit 300 are provided on a rear side of the television receiver 1000. A display 400 such as a plasma display panel (PDP), a liquid crystal display (LCD) or a cathode ray tube (CRT) is provided on a front side of the television receiver 1000. In addition, a sound output device (not shown) such as a speaker is provided on the front side of the television receiver 1000.

The power supply unit 100 is connected to a commercial power supply through a power supply plug (not shown). The power supply unit 100 converts an AC voltage supplied from the commercial power supply to a DC voltage, and supplies the DC voltage to the system board 200, the display drive unit 300, the display 400 and the sound output device.

The system board 200 processes a broadcasting signal input from an antenna 901 (see FIG. 2), outputs a video signal to the display drive unit 300, and outputs a sound signal to the sound output device.

The display drive unit 300 generates a drive signal based on the video signal input from the system board 200, and outputs the generated drive signal to the display 400. This causes video to be displayed on the display 400.

The sound output device, not shown, outputs sound based on the sound signal input from the system board 200.

(2) Configuration and Function of the System Board

Figure 2:
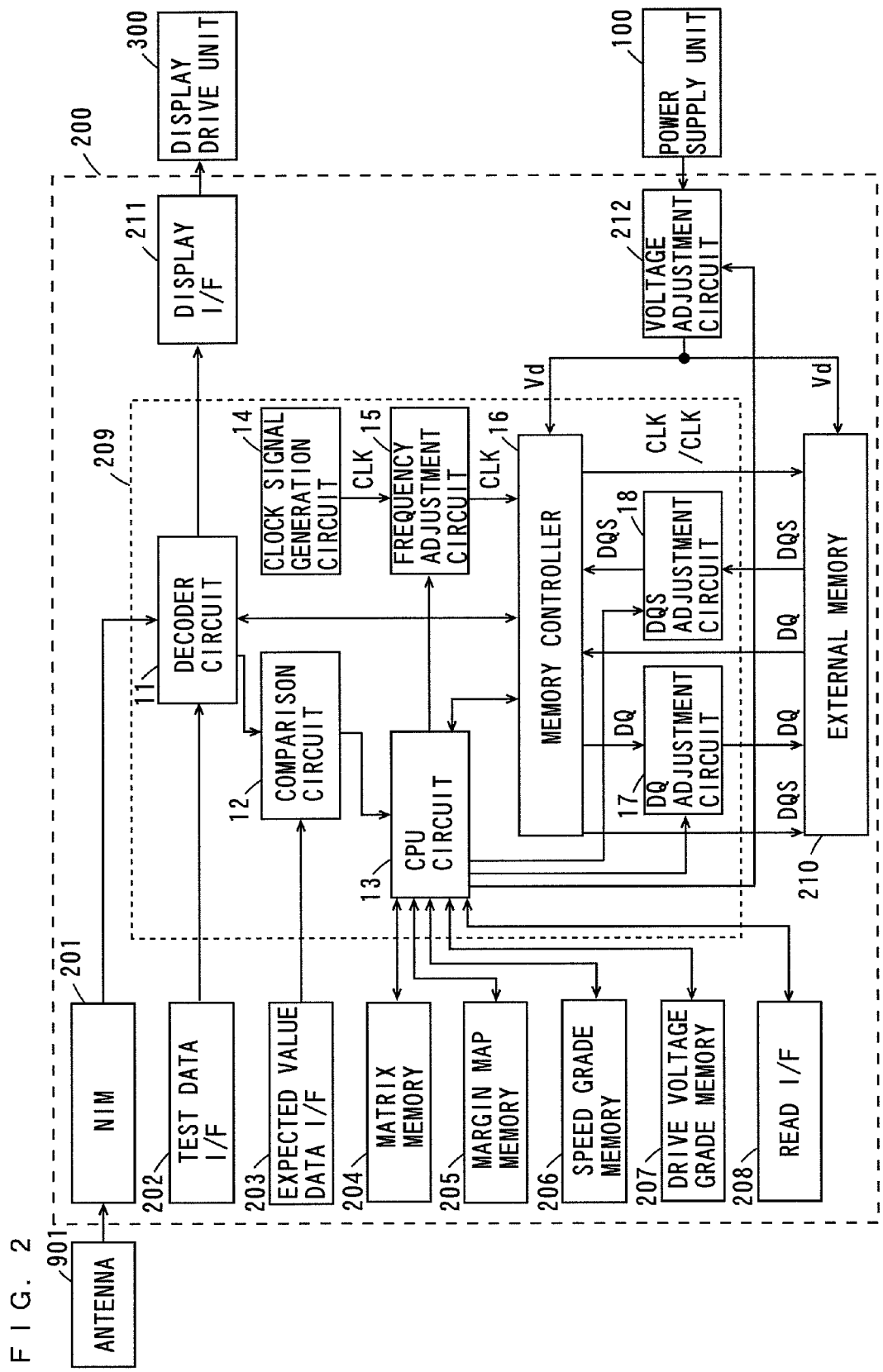
FIG. 2 is a block diagram showing the configuration of a system board.

Next, description is made of the system board 200. FIG. 2 is a block diagram showing the configuration of the system board 200.

As shown in FIG. 2, the system board 200 includes an NIM (Network Interface Module) 201, a test data interface 202, an expected value data interface 203, a matrix memory 204, a margin map memory 205, a speed grade memory 206, a drive voltage grade memory 207, a read interface 208, a system LSI 209, an external memory 210, a display interface 211 and a voltage adjustment circuit 212.

The system LSI 209 includes a decoder circuit 11, a comparison circuit 12, a CPU (Central Processing Unit) circuit 13, a clock signal generation circuit 14, a frequency adjustment circuit 15, a memory controller 16, a data signal (DQ) adjustment circuit 17 and a data strobe signal (DQS) adjustment circuit 18.

In the present embodiment, an operation guarantee system is constituted by the test data interface 202, the expected value data interface 203, the foregoing memories 204 to 207, the system LSI 209 and the voltage adjustment circuit 212.

The NIM 201 selects one digital broadcasting signal out of the plurality of digital broadcasting signals input from the antenna 901. Moreover, the NIM 201 demodulates the selected digital broadcasting signal, and outputs a transport stream in conformity with the MPEG (Motion Picture Experts Group)-2 standard to the decoder circuit 11 of the system LSI 209.

The decoder circuit 11 decodes a digital video signal from the transport stream input from the NIM 201, and outputs the decoded digital video signal to the display drive unit 300 through the display interface 211. The display drive unit 300 generates the drive signal based on the digital video signal input from the decoder circuit 11, and outputs the generated drive signal to the display 400 (FIG. 1). This causes video to be displayed on the display 400.

Moreover, the decoder circuit 11 decodes a digital sound signal from the transport stream input from the NIM 201, and outputs the decoded digital sound signal to a sound circuit that is not shown. The sound circuit performs D/A (Digital/Analog) conversion to the digital sound signal supplied from the decoder circuit 11, and outputs the analog sound signal to the sound output device. This causes sound to be output from the sound output device.

A test data signal that has been encoded (hereinafter referred to as an encoded test signal) is input from the exterior to the decoder circuit 11 through the test data interface 202. The decoder circuit 11 decodes the test data signal from the foregoing encoded test signal, and outputs the decoded test data signal to the comparison circuit 12. Note that a digital video signal, for example, can be used as the test data signal.

An expected value data signal is input from the exterior to the comparison circuit 12 through the expected value data interface 203. Note that the expected value data signal has a value that is equal to the foregoing test data signal that is decoded by the decoder circuit 11 when the system LSI 209 and the external memory 210 are in normal operation. Accordingly, the expected value data signal input to the comparison circuit 12 varies corresponding to the encoded test signal input to the decoder circuit 11.

The comparison circuit 12 compares the test data signal input from the decoder circuit 11 and the expected value data signal input from the exterior. Then, the comparison circuit 12 determines whether or not the test data signal decoded in the decoder circuit 11 is a normal value based on a result of comparison, and outputs a determination signal to the CPU circuit 13.

Note that in the following paragraphs, the determination signal output from the comparison circuit 12 when the test data signal decoded in the decoder circuit 11 is determined to have the normal value is referred to as a normal signal, and the determination signal output from the comparison circuit 12 when the test data signal decoded in the decoder circuit 11 is not determined to have the normal value is referred to as an error signal.

The CPU circuit 13 stores predetermined data in the matrix memory 204, the margin map memory 205, the speed grade memory 206 and the drive voltage grade memory 207 based on an operation program stored in a memory, not shown, and the foregoing determination signal input from the comparison circuit 12. The CPU circuit 13 outputs a control signal to the frequency adjustment circuit 15, the DQ adjustment circuit 17, the DQS adjustment circuit 18 and the voltage adjustment circuit 212 according to the foregoing operation program. The operation of the CPU circuit 13 will be described later.

The clock signal generation circuit 14 generates a clock signal CLK of a predetermined frequency, and outputs the generated clock signal CLK to the frequency adjustment circuit 15.

The frequency adjustment circuit 15 adjusts the frequency of the clock signal CLK (hereinafter referred to as the clock frequency) input from the clock signal generation circuit 14 based on the control signal input from the CPU circuit 13, and outputs the adjusted clock signal CLK to the memory controller 16. Note that the frequency adjustment circuit 15 sets the clock frequency to any of 667 MHz, 720 MHz and 800 MHz in the present embodiment.

The external memory 210 is a working memory that functions as a processing area of the decoder circuit 11 and the CPU circuit 13 while being a secondary cache memory of the CPU circuit 13. In the present embodiment, a DDR-SDRAM (Double Data Rate Synchronous Dynamic Random Access Memory) is used as the external memory 210. The decoder circuit 11 and the CPU circuit 13 are electrically connected to the external memory 210 through the memory controller 16.

The memory controller 16 generates clock signals CLK,/CLK of the same phase/opposite phase as/to the clock signal CLK based on the clock signal CLK input from the frequency adjustment circuit 15, and outputs the generated clock signals CLK,/CLK to the external memory 210.

The data signal and the control signal are input from the decoder circuit 11 and the CPU circuit 13 to the memory controller 16. The memory controller 16 generates a data signal DQ and a data strobe signal DQS based on the foregoing data signal and control signal, and outputs the data signal DQ and the data strobe signal DQS to the DQ adjustment circuit 17 and the external memory 210, respectively. Note that the memory controller 16 outputs the data signal DQ and the data strobe signal DQS in response to the clock signal CLK input from the frequency adjustment circuit 15.

The DQ adjustment circuit 17 delays the data signal DQ input from the memory controller 16 by a predetermined time period based on the control signal input from the CPU circuit 13 to output the data signal DQ to the external memory 210.

The data signal DQ is input to the external memory 210 in response to the clock signals CLK,/CLK input from the memory controller 16. The data signal DQ is written in the external memory 210 in response to the data strobe signal DQS input from the memory controller 16.

The external memory 210 outputs the data signal DQ and the data strobe signal DQS to the memory controller 16 and the DQS adjustment circuit 18, respectively, in response to the clock signals CLK,/CLK input from the memory controller 16.

The DQS adjustment circuit 18 delays the data strobe signal DQS input from the external memory 210 by the predetermined time period based on the control signal input from the CPU circuit 13 to output the data strobe signal DQS to the memory controller 16.

The data signal DQ is written in the memory controller 16 in response to the data strobe signal DQS. The memory controller 16 outputs the data signal DQ to the decoder circuit 11 or the CPU circuit 13. In this manner, writing and reading of the data signal DQ is performed between the decoder circuit 11 or the CPU circuit 13 and the external memory 210.

A power supply voltage is supplied from the power supply unit 100 to the voltage adjustment circuit 212. The voltage adjustment circuit 212 adjusts the power supply voltage supplied from the power supply unit 100 to a predetermined voltage based on the control signal input from the CPU circuit 13 to supply the power supply voltage to the memory controller 16 and the external memory 210.

The voltage supplied from the voltage adjustment circuit 212 to the memory controller 16 and the external memory 210 will be referred to as a drive voltage Vd. Note that the voltage adjustment circuit 212 can adjust the drive voltage Vd in a range from 1.5 (V) to 2.1 (V) in the present embodiment. A voltage value of the drive voltage Vd adjusted by the voltage adjustment circuit 212 is measured by a voltage measurement circuit that is not shown. The CPU circuit 13 monitors the voltage value measured by the voltage measurement circuit.

(3) Relationship Between the Data Signal DQ and the Data Strobe Signal DQS

Next, description will be made of a relationship between the data signal DQ and the data strobe signal DQS.

Figure 3:
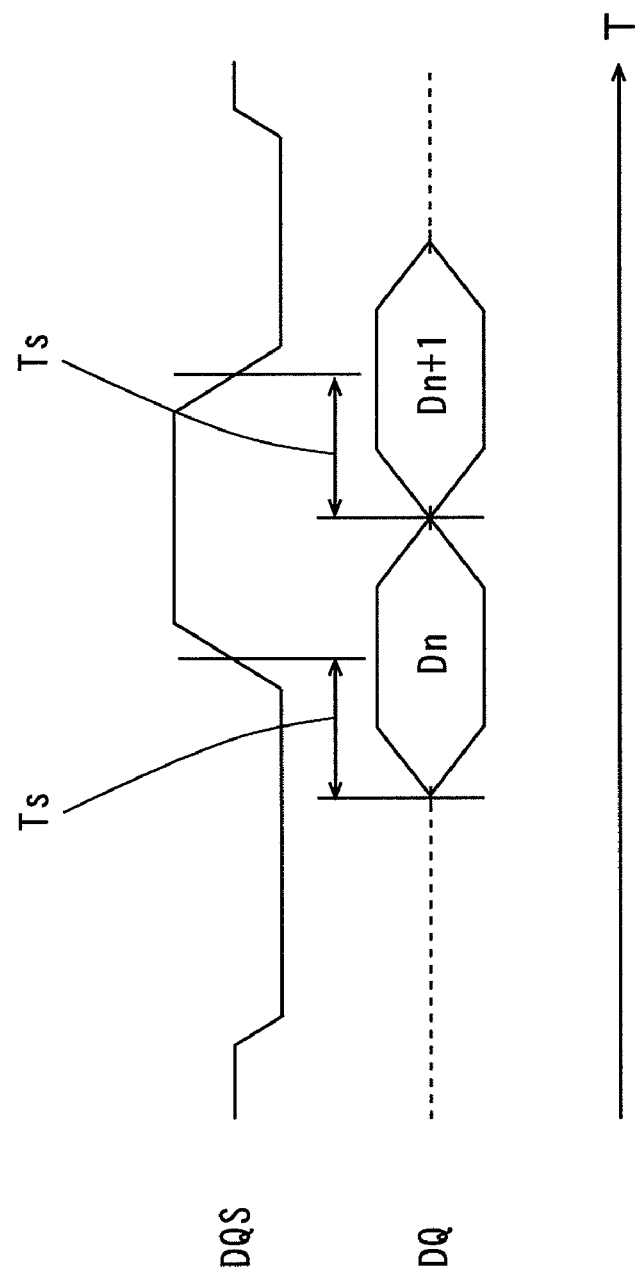
FIG. 3 is a timing chart of a data signal and a data strobe signal input to an external memory and a memory controller.

FIG. 3 is a timing chart of the data signal DQ and the data strobe signal DQS input to the external memory 210 (FIG. 2) and the memory controller 16 (FIG. 2).

In the external memory 210 and the memory controller 16, data $D_n$ is loaded at a substantially intermediate time point of a rising edge of the data strobe signal DQS, and data $D_{n+1}$ is loaded at a substantially intermediate time point of a dropping edge of the data strobe signal DQS.

Here, a difference between a starting time point of the data $D_n$ (a time point at which the data signal DQ varies) and the substantially intermediate time point of the rising edge of the data strobe signal DQS and a difference between a starting time point of the data $D_{n+1}$ and the substantially intermediate time point of the dropping edge of the data strobe signal DQS are referred to as setup periods Ts as shown in FIG. 3.

In the present embodiment, an initial value of the setup period Ts (hereinafter referred to as an initial setup period Ts1) is set to 100 ps. Thus, a signal delay amount in the DQ adjustment circuit 17 (FIG. 2) and the DQS adjustment circuit 18 (FIG. 2) is set such that the setup period Ts in the external memory 210 and the memory controller 16 is 100 ps in an initial state of the system board 200 (FIG. 2).

Note that the initial setup period Ts1 is the optimum setup period Ts determined in design in consideration of performance of the external memory 210 and the memory controller 16.

(4) Control Operation of the CPU Circuit

Next, description will be made of the control operation of the CPU circuit 13.

Figure 4:
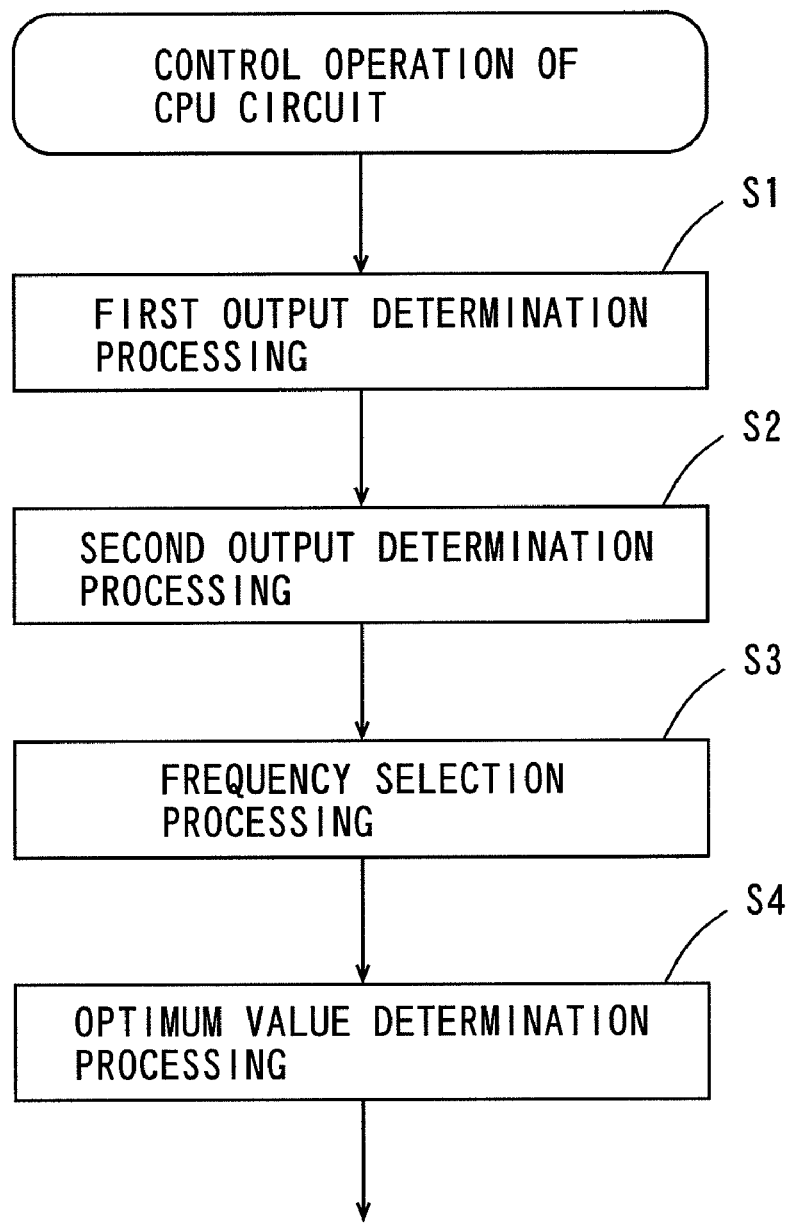
FIG. 4 is a flowchart showing a control operation of a CPU circuit.

FIG. 4 is a flowchart showing the control operation of the CPU circuit 13.

As shown in FIG. 4, the CPU circuit 13 sequentially performs first output determination processing (Step S1), second output determination processing (Step S2), frequency selection processing (Step S3) and optimum value determination processing (Step S4).

In the first and second output determination processing, the CPU circuit 13 determines whether or not an output error is occurring in the decoder circuit 11 under various conditions. The CPU circuit 13 stores a result of the determination in the matrix memory 204.

In the frequency selection processing, the CPU circuit 13 selects an appropriate clock frequency for properly operating the system LSI 209 and the external memory 210 (the system board 200) based on the results of the first and second output determination processing.

In the optimum value determination processing, the CPU circuit 13 determines the appropriate drive voltage Vd and the highest frequency of the clock signal CLK at which the system LSI 209 and the external memory 210 can be properly operated based on the results of the first and second output determination processing and the frequency selection processing.

Hereinafter, detailed description will be made of the first output determination processing, the second output determination processing, the frequency selection processing and the optimum value determination processing by referring to the drawings.

(4-1) The First Output Determination Processing (a) Storage Regions

In the first output determination processing (Step S1 of FIG. 4), the CPU circuit 13 varies the clock frequency set in the frequency adjustment circuit 15, the delay amount of the data signal DQ in the DQ adjustment circuit 17 and the drive voltage Vd supplied from the voltage adjustment circuit 212.

In addition, the CPU circuit 13 determines whether or not the output error is occurring in the decoder circuit 11 under the various conditions based on the determination signal output from the comparison circuit 12. Then, the CPU circuit 13 stores the result of the determination in a predetermined storage region of the matrix memory 204 (FIG. 2) as first determination information.

Note that the delay amount of the data strobe signal DQS in the DQS adjustment circuit 18 is fixed to the delay amount in the initial state (the initial amount) in the first output determination processing.

Figure 5:
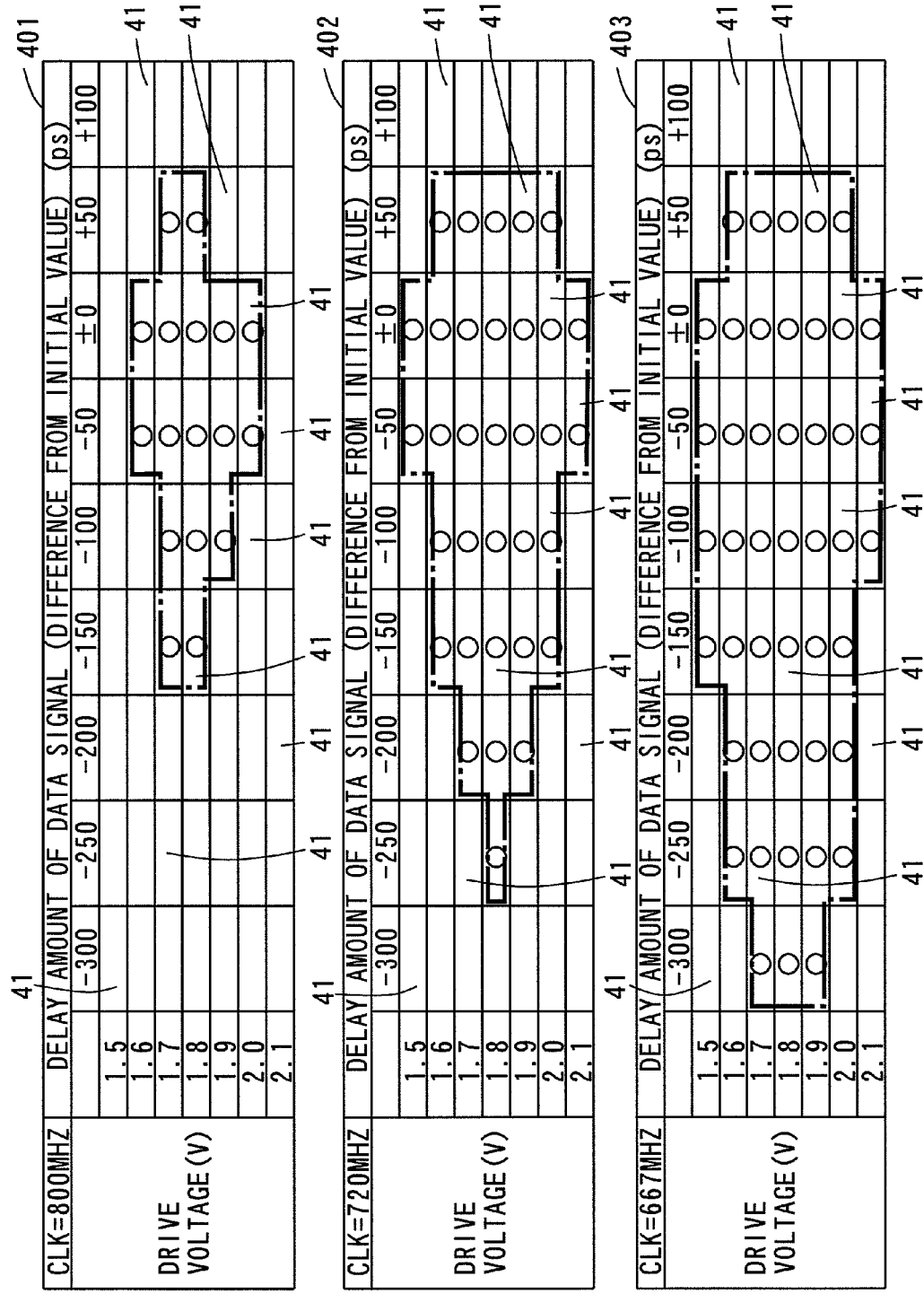
FIG. 5 is a conceptual diagram of storage regions used in first output determination processing.

FIG. 5 is a conceptual diagram of storage regions used in the first output determination processing.

As shown in FIG. 5, three storage regions 401, 402, 403 of the matrix memory 204 are used in the first output determination processing. The first determination information when the clock frequency is adjusted to 800 MHz in the frequency adjustment circuit 15 is stored in the storage region 401, the first determination information when the clock signal frequency is adjusted to 720 MHz is stored in the storage region 402, and the first determination information when the clock signal frequency is adjusted to 667 MHz is stored in the storage region 403.

Each of the storage regions 401, 402, 403 has a plurality of flag addresses 41. Each flag address 41 is provided to correspond to one of the plurality of delay amounts of the data signal DQ and one of the plurality of drive voltages Vd.

In FIG. 5, the delay amounts of the data signal DQ are shown as differences from the delay amount (the initial value) of the data signal DQ in the DQ adjustment circuit 17 in the initial state. Therefore, the delay amount of ±0 ps in FIG. 5 indicates the delay amount of the data signal DQ in the DQ adjustment circuit 17 in the initial state.

Note that in a state where the delay amount of the data strobe signal DQS is fixed, the setup period Ts is shortened with increasing the delay amount of the data signal DQ, and the setup period Ts is lengthened with decreasing the delay amount of the data signal DQ as shown in FIG. 3.

As described above, the delay amount of the data signal DQ is set such that the setup period Ts in the external memory 210 is 100 ps in the DQ adjustment circuit 17 in the initial state. Accordingly, in FIG. 5, the delay amount of +50 ps indicates the delay amount of the data signal DQ set such that the setup period Ts in the external memory 210 is 50 ps, and the delay amount of −50 ps indicates the delay amount of the data signal DQ set such that the setup period Ts in the external memory 210 is 150 ps.

Note that the CPU circuit 13 controls the delay amount of the data signal DQ in the DQ adjustment circuit 17 such that the setup period Ts varies in a range from 0 ps to 400 ps, and controls the voltage adjustment circuit 212 such that the drive voltage Vd varies in a range from 1.5 V to 2.1 V in the first output determination processing.

When the normal signal is output from the comparison circuit 12, the CPU circuit 13 sets a flag to the flag address 41 corresponding to the delay amount of the data signal DQ and the drive voltage Vd at that time. Note that the flag is indicated by "○" in the example of FIG. 5.

(b) Control Flow of the CPU Circuit in the First Output Determination Processing Detailed description will be made of the control operation of the CPU circuit 13 in the first output determination processing.

FIGS. 6 to 10 are flowcharts showing the control operation of the CPU circuit 13 in the first output determination processing.

Figure 6:
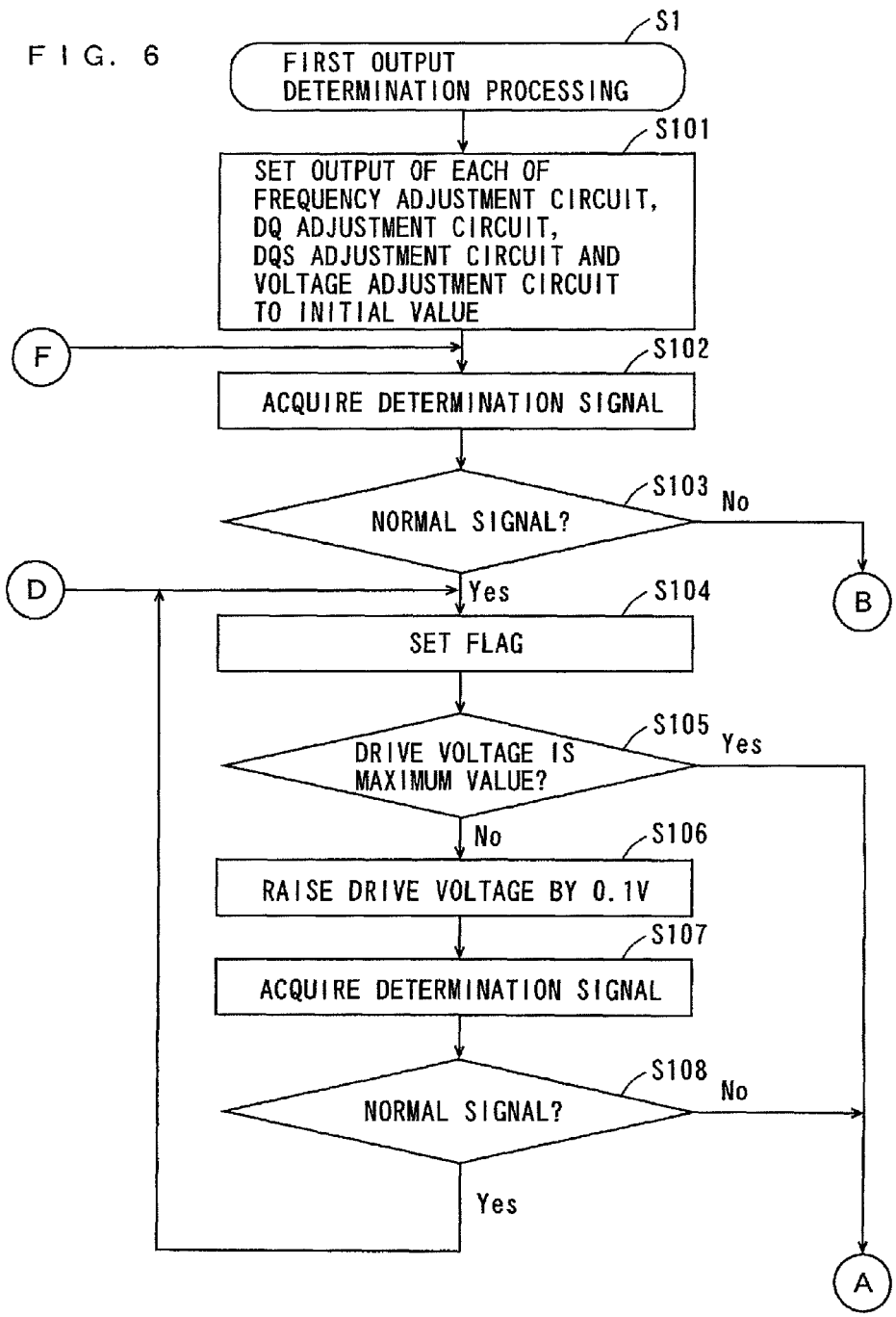
FIG. 6 is a flowchart showing the control operation of the CPU circuit in the first output determination processing.

As shown in FIG. 6, first, the CPU circuit 13 sets the output of each of the frequency adjustment circuit 15, the DQ adjustment circuit 17, the DQS adjustment circuit 18 and the voltage adjustment circuit 212 to the initial value (Step S101).

Note that the initial value of the clock frequency set in the frequency adjustment circuit 15 is 800 MHz, and the initial value of the drive voltage Vd set in the voltage adjustment circuit 212 is 1.8 V in the present embodiment. In addition, the initial value of the delay amount of the DQ adjustment circuit 17 and the initial value of the delay amount of the DQS adjustment circuit 18 are set such that the setup period Ts in the external memory 210 and the memory controller 16 is 100 ps.

Next, the CPU circuit 13 acquires the determination signal output from the comparison circuit 12 (Step S102). Then, the CPU circuit 13 determines whether or not the determination signal acquired in Step S102 is the normal signal (Step S103). When the determination signal acquired in Step S102 is the normal signal, the CPU circuit 13 determines that the output error is not occurring in the decoder circuit 11, and sets the flag to the flag address 41 corresponding to the current clock frequency, delay amount of the data signal DQ and drive voltage Vd (Step S104).

When the clock frequency is 800 MHz, the delay amount of the data signal DQ is ±0 ps, and the drive voltage Vd is 1.8 V, for example, the CPU circuit 13 sets the flag to the flag address 41 of the storage region 401 corresponding to the delay amount of ±0 ps and the drive voltage Vd of 1.8 V (FIG. 5).

Next, the CPU circuit 13 determines whether or not the drive voltage Vd supplied from the voltage adjustment circuit 212 is set to the maximum value (2.1 V in the present embodiment) (Step S105). When the drive voltage Vd is not set to the maximum value, the CPU circuit 13 raises the drive voltage Vd by 0.1V (step S106). The CPU circuit 13 subsequently acquires the determination signal output from the comparison circuit 12 (Step S107).

The CPU circuit 13 then determines whether or not the determination signal acquired in Step S107 is the normal signal (Step S108). When the determination signal acquired in Step S107 is the normal signal, the CPU circuit 13 determines that the output error is not occurring in the decoder circuit 11, returns to the process of Step S104, and sets the flag to the corresponding flag address 41.

The CPU circuit 13 repeats the processes of Steps S104 to S108 until the drive voltage Vd is determined to be the maximum value in Step S105 or until the determination signal is not determined to be the normal signal in Step S108.

Figure 7:
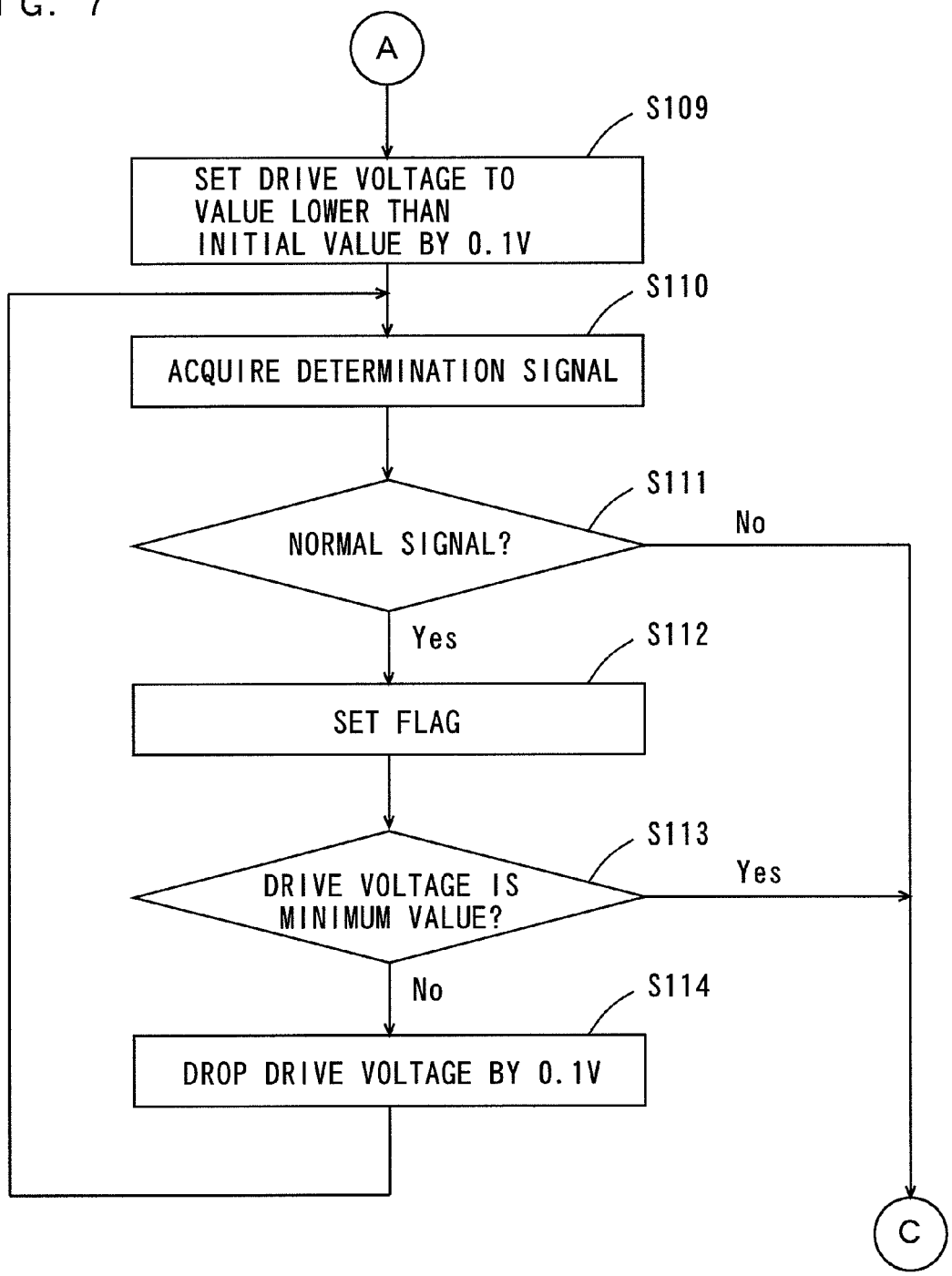
FIG. 7 is a flowchart showing the control operation of the CPU circuit in the first output determination processing.

When the drive voltage Vd is determined to be the maximum value in Step S105, or when the determination signal is not determined to be the normal signal in Step S108, the CPU circuit 13 sets the drive voltage Vd to a value lower than the initial value by 0.1 V (1.7V in the present embodiment) as shown in FIG. 7 (Step S109).

Then, the CPU circuit 13 acquires the determination signal output from the comparison circuit 12 (Step S110). The CPU circuit 13 subsequently determines whether or not the determination signal acquired in Step S110 is the normal signal (Step S111). When the determination signal acquired in Step S110 is the normal signal, the CPU circuit 13 determines that the output error is not occurring in the decoder circuit 11, and sets the flag to the corresponding flag address 41 (Step S112).

The CPU circuit 13 subsequently determines whether or not the drive voltage Vd supplied from the voltage adjustment circuit 212 is set to the minimum value (1.5 V in the present embodiment) (Step S113). When the drive voltage Vd is not set to the minimum value, the CPU circuit 13 drops the drive voltage Vd by 0.1 V (Step S114). The CPU circuit 13 then returns to the process of Step S110.

The CPU circuit 13 repeats the processes of Steps S110 to S114 until the determination signal is not determined to be the normal signal in Step S111 or until the drive voltage Vd is determined to be the minimum value in Step S113.

Figure 8:
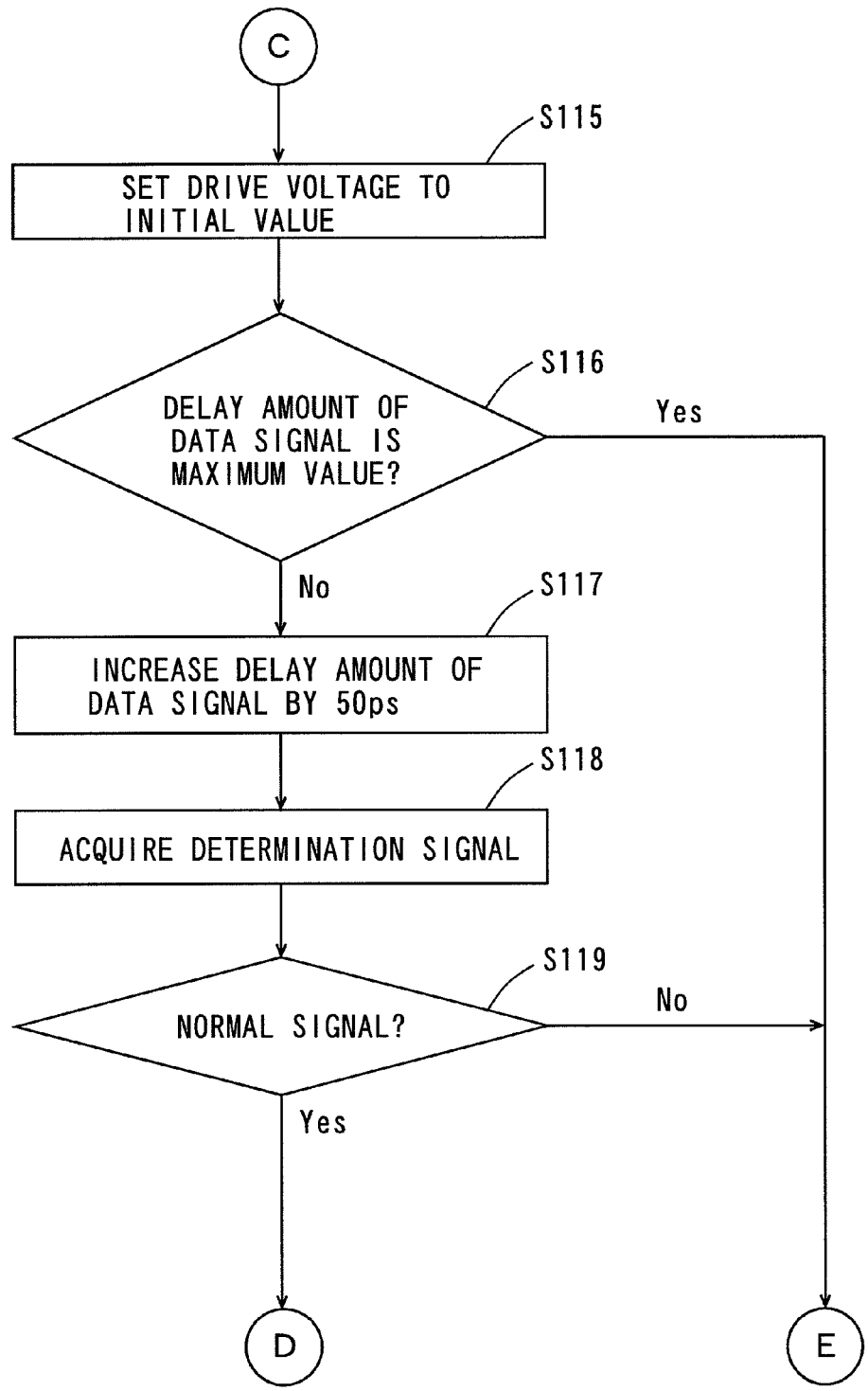
FIG. 8 is a flowchart showing the control operation of the CPU circuit in the first output determination processing.

When the determination signal is not determined to be the normal signal in Step S111, or when the drive voltage Vd is determined to be the minimum value in Step S113, the CPU circuit 13 sets the drive voltage Vd to the initial value as shown in FIG. 8 (Step S115).

Next, the CPU circuit 13 determines whether or not the delay amount of the data signal DQ in the DQ adjustment circuit 17 is the maximum value (+100 ps in the present embodiment) (Step S116). When the delay amount of the data signal DQ in the DQ adjustment circuit 17 is not the maximum value, the CPU circuit 13 increases the delay amount of the data signal DQ in the DQ adjustment circuit 17 by 50 ps (Step S117).

The CPU circuit 13 then acquires the determination signal output from the comparison circuit 12 (Step S118). The CPU circuit 13 subsequently determines whether or not the determination signal acquired in Step S118 is the normal signal (Step S119). When the determination signal acquired in Step S118 is the normal signal, the CPU circuit 13 determines that the output error is not occurring in the decoder circuit 11 to return to the process of Step S104 of FIG. 6 and set the flag to the corresponding flag address 41.

The CPU circuit 13 repeats the processes of Steps S104 to S119 of FIGS. 6 to 8 until the delay amount of the data signal DQ is determined to be the maximum value in Step S116 or until the determination signal is not determined to be the normal signal in Step S119.

Figure 9:
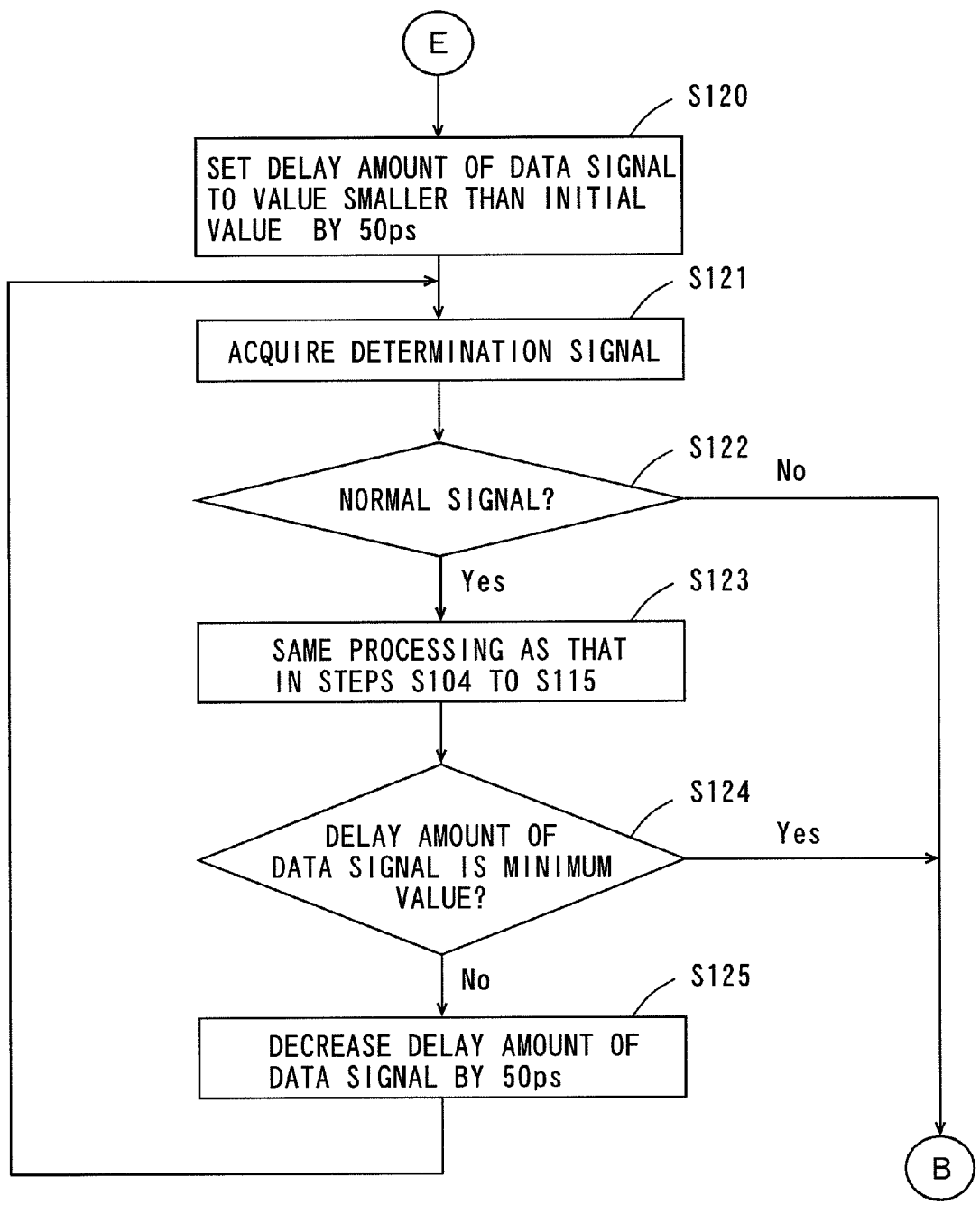
FIG. 9 is a flowchart showing the control operation of the CPU circuit in the first output determination processing.

When the delay amount of the data signal DQ is determined to be the maximum value in Step S116 of FIG. 8 or when the determination signal is not determined to be the normal signal in Step S119, the CPU circuit 13 sets the delay amount of the data signal DQ in the DQ adjustment circuit 17 to a value smaller than the initial value by 50 ps, that is, −50 ps as shown in FIG. 9 (Step S120).

The CPU circuit 13 then acquires the determination signal output from the comparison circuit 12 (Step S121), and determines whether or not the determination signal acquired in Step S121 is the normal signal (Step S122). When the determination signal acquired in Step S121 is the normal signal, the CPU circuit 13 performs the same processing as that in Steps S104 to S115 described referring to FIGS. 6 to 8 (Step S123).

Next, the CPU circuit 13 determines whether or not the delay amount of the data signal DQ in the DQ adjustment circuit 17 is the minimum value (−300 ps in the present embodiment) (Step S124). When the delay amount of the data signal DQ is not the minimum value, the CPU circuit 13 decreases the delay amount of the data signal DQ in the DQ adjustment circuit 17 by 50 ps (Step S125). Then, the CPU circuit 13 returns to the process of Step S121.

The CPU circuit 13 repeats the processes of Steps S121 to S125 until the determination signal is not determined to be the normal signal in Step S122 or until the delay amount of the data signal DQ is determined to be the minimum value in Step S124.

Figure 10:
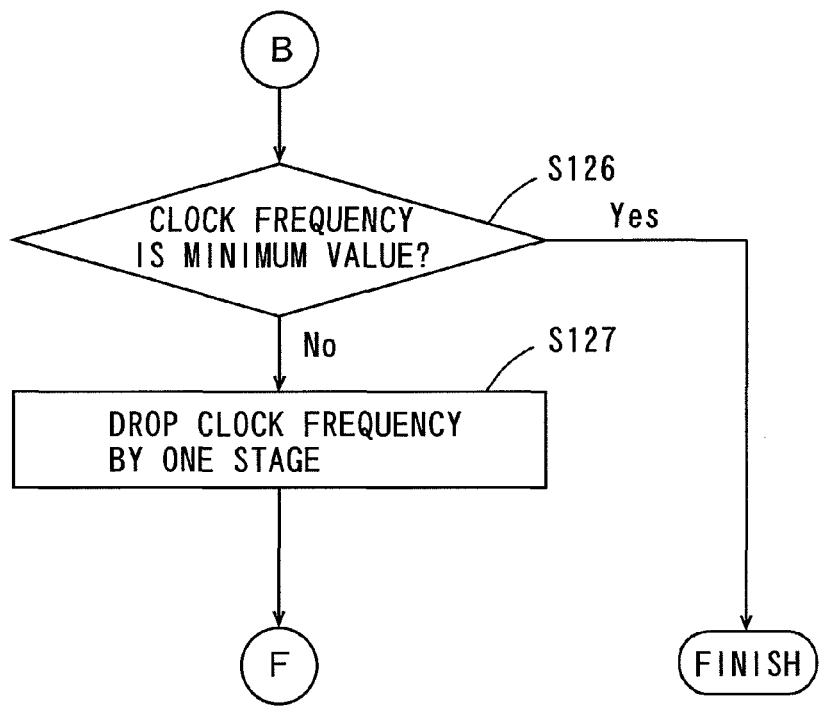
FIG. 10 is a flowchart showing the control operation of the CPU circuit in the first output determination processing.

When the determination signal is not determined to be the normal signal in Step S122, or when the delay amount of the data signal DQ is determined to be the minimum value in Step S124, the CPU circuit 13 determines that derivation of the first determination information is finished in the current clock frequency, and determines whether or not the clock frequency is adjusted to the minimum value (667 MHz in the present embodiment) in the frequency adjustment circuit 15 as shown in FIG. 10 (Step S126).

When the clock frequency is not the minimum value, the CPU circuit 13 drops the clock frequency by one stage (Step S127). When the clock frequency is 800 MHz in Step S126, for example, the CPU circuit 13 sets the clock frequency to 720 MHz in Step S127, and then returns to the process of Step S102 of FIG. 6.

When the determination signal is not determined to be the normal signal in Step S103 of FIG. 6, the CPU circuit 13 determines that the output error is occurring in the decoder circuit 11, and proceeds to the process of Step S126 of FIG. 10 without setting the flag to the flag address 41.

When the clock frequency is determined to be the minimum value in Step S126 of FIG. 10, the CPU circuit 13 determines that the determination processing of the output error in the decoder circuit 11 is finished in all the clock frequencies to finish the first output determination processing. Accordingly, the first determination information indicated by the states of the flags is stored for each frequency in the matrix memory 204.

(4-2) The Second Output Determination Processing (a) Storage Regions

In the second output determination processing (Step S2 of FIG. 4), the CPU circuit 13 varies the clock frequency set in the frequency adjustment circuit 15, the delay amount of the data strobe signal DQS in the DQS adjustment circuit 18 and the drive voltage Vd supplied from the voltage adjustment circuit 212.

In addition, the CPU circuit 13 determines whether or not the output error is occurring in the decoder circuit 11 under various conditions based on the determination signal output from the comparison circuit 12. Then, the CPU circuit 13 stores the result of the determination in a predetermined storage region of the matrix memory 204 (FIG. 2) as the second determination information.

Note that the delay amount of the data signal DQ in the DQ adjustment circuit 17 is fixed to the delay amount in the initial state (the initial value) in the second output determination processing.

Figure 11:
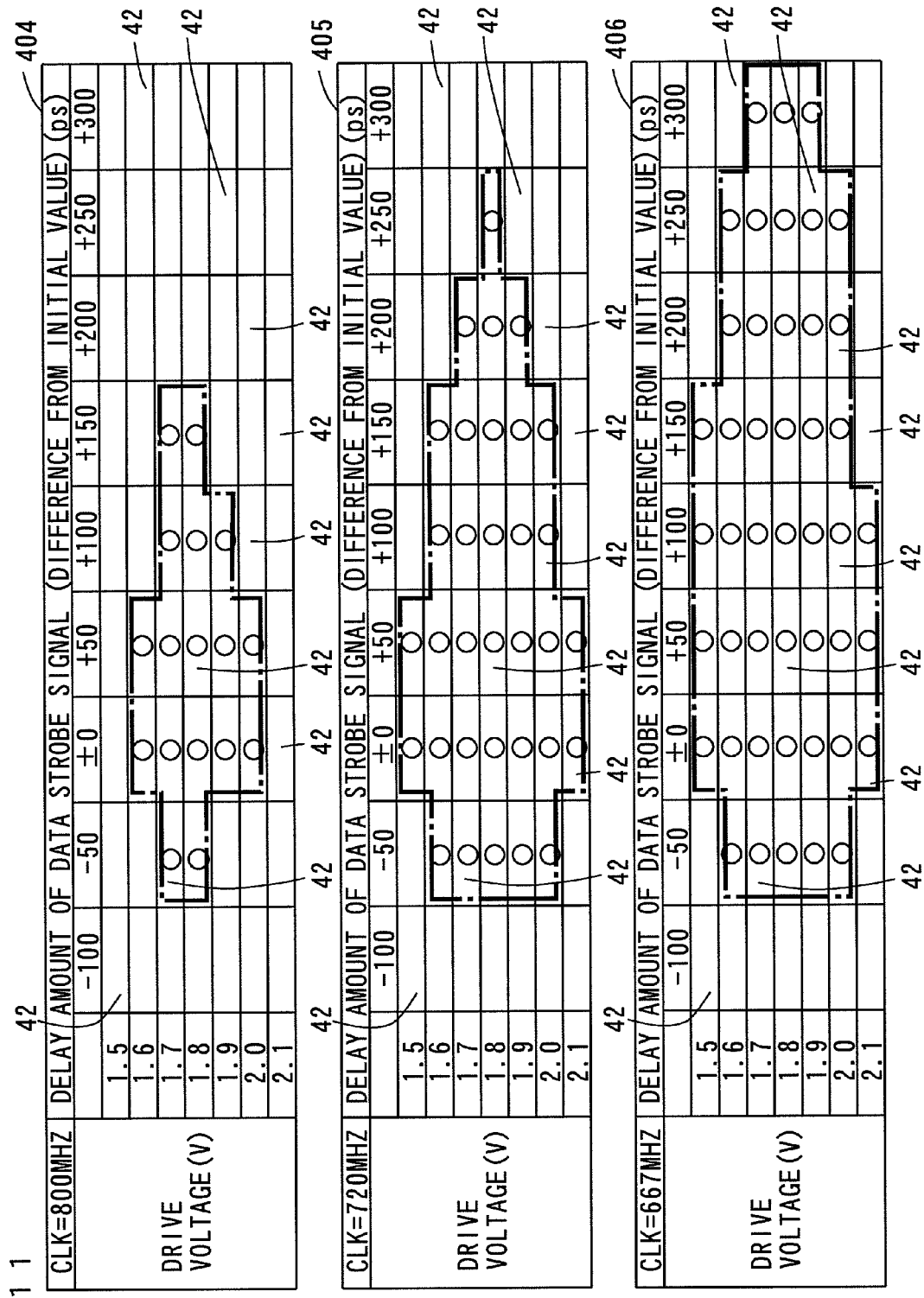
FIG. 11 is a conceptual diagram of storage regions used in second output determination processing.

FIG. 11 is a conceptual diagram of storage regions used in the second output determination processing.

As shown in FIG. 11, three storage regions 404, 405, 406 of the matrix memory 204 are used in the second output determination processing. The second determination information when the clock frequency is adjusted to 800 MHz in the frequency adjustment circuit 15 is stored in the storage region 404, the second determination information when the clock frequency is adjusted to 720 MHz is stored in the storage region 405, and the second determination information when the clock signal frequency is adjusted to 667 MHz is stored in the storage region 406.

Each of the storage regions 404, 405, 406 has a plurality of flag addresses 42. Each flag address 42 is provided corresponding to one of the plurality of delay amounts of the data strobe signal DQS and one of the plurality of drive voltages Vd.

In FIG. 11, the delay amounts of the data strobe signal DQS are shown as differences from the delay amount (the initial value) of the data strobe signal DQS in the DQS adjustment circuit 18 in the initial state. Thus, the delay amount of ±0 ps in FIG. 11 indicates the delay amount of the data strobe signal DQS in the DQS adjustment circuit 18 in the initial state.

Note that in a state where the delay amount of the data signal DQ is fixed, the setup period Ts is lengthened with increasing the delay amount of the data strobe signal DQS, and the setup period Ts is shortened with decreasing the delay amount of the data strobe signal DQS as shown in FIG. 3.

As described above, the delay amount of the data strobe signal DQS is set such that the setup period Ts in the memory controller 16 is 100 ps in the DQS adjustment circuit 18 in the initial state. Accordingly, in FIG. 11, the delay amount of +50 ps indicates the delay amount of the data strobe signal DQS set such that the setup period Ts in the memory controller 16 is 150 ps, and the delay amount of −50 ps indicates the delay amount of the data strobe signal DQS set such that the setup period Ts in the memory controller 16 is 50 ps.

Note that the CPU circuit 13 controls the delay amount of the data strobe signal DQS in the DQS adjustment circuit 18 such that the setup period Ts varies in the range from 0 ps to 400 ps, and controls the voltage adjustment circuit 212 such that the drive voltage Vd varies in the range from 1.5 V to 2.1 V in the second output determination processing.

When the normal signal is output from the comparison circuit 12, the CPU circuit 13 sets the flag to the flag address 42 corresponding to the delay amount of the data strobe signal DQS and the drive voltage Vd at that time. Note that the flag is indicated by "○" in the example of FIG. 11.

(b) Control Flow of the CPU Circuit in the Second Output Determination Processing Detailed description will be made of the control operation of the CPU circuit 13 in the second output determination processing.

FIGS. 12 to 16 are flowcharts showing the control operation of the CPU circuit 13 in the second output determination processing.

Figure 12:
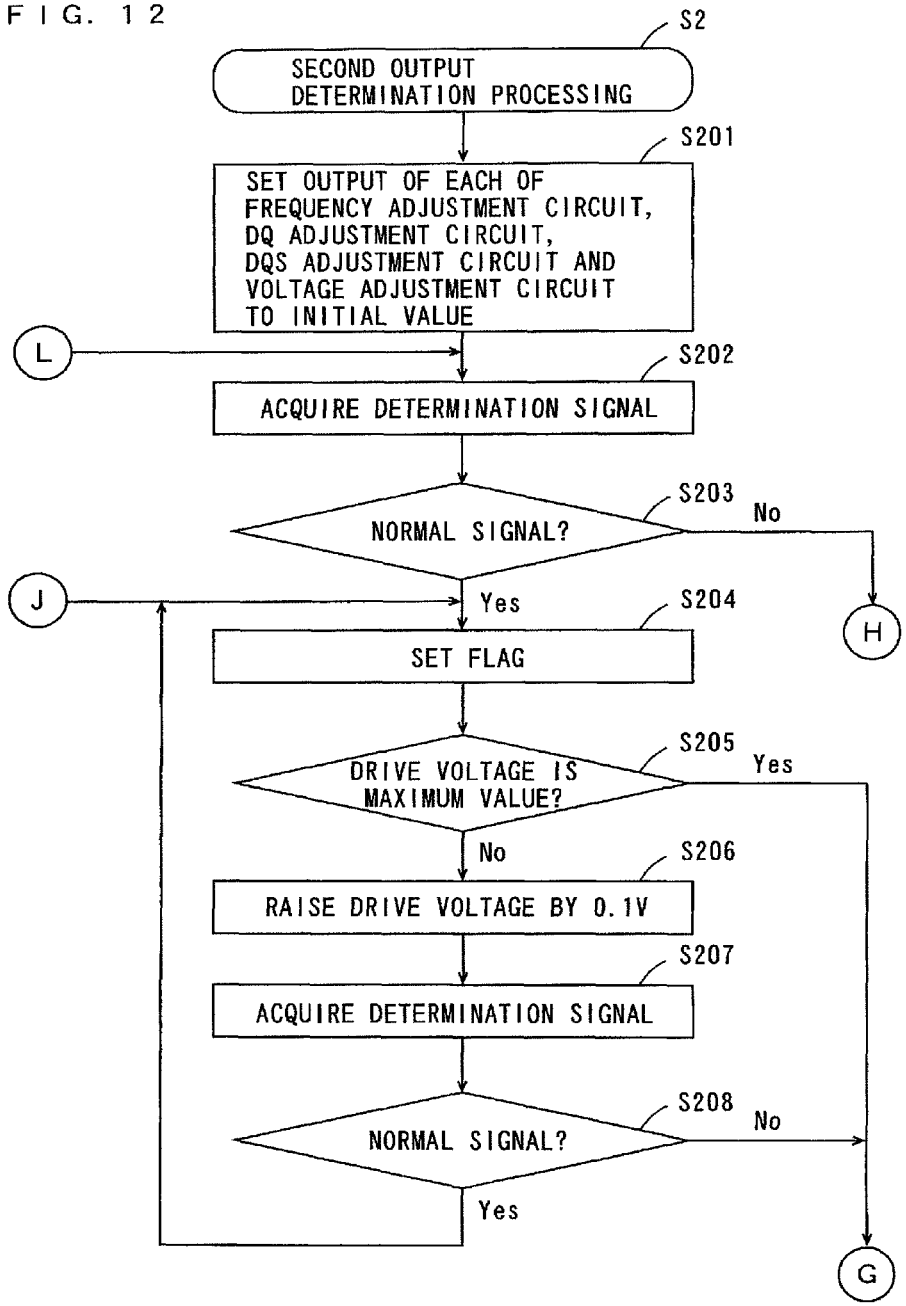
FIG. 12 is a flowchart showing a control operation of the CPU circuit in the second output determination processing.

As shown in FIG. 12, first, the CPU circuit 13 sets the output of each of the frequency adjustment circuit 15, the DQ adjustment circuit 17, the DQS adjustment circuit 18 and the voltage adjustment circuit 212 to the initial value (Step S201).

Note that the initial value of the clock frequency set in the frequency adjustment circuit 15 is 800 MHz, and the initial value of the drive voltage Vd set in the voltage adjustment circuit 212 is 1.8 V as described above. In addition, the initial value of the delay amount of the DQ adjustment circuit 17 and the initial value of the delay amount of the DQS adjustment circuit 18 are set such that the setup period Ts in the external memory 210 and the memory controller 16 is 100 ps.

Next, the CPU circuit 13 acquires the determination signal output from the comparison circuit 12 (Step S202). Then, the CPU circuit 13 determines whether or not the determination signal acquired in Step S202 is the normal signal (Step S203). When the determination signal acquired in Step S202 is the normal signal, the CPU circuit 13 determines that the output error is not occurring in the decoder circuit 11, and sets the flag to the flag address 42 corresponding to the current clock frequency, delay amount of the data signal DQS and drive voltage Vd (Step S204).

When the clock frequency is 800 MHz, the delay amount of the data strobe signal DQS is ±0 ps, and the drive voltage Vd is 1.8 V, for example, the CPU circuit 13 sets the flag to the flag address 42 of the storage region 404 corresponding to the delay amount of ±0 ps and the drive voltage Vd of 1.8 V (FIG. 11).

Next, the CPU circuit 13 determines whether or not the drive voltage Vd supplied from the voltage adjustment circuit 212 is set to the maximum value (2.1 V in the present embodiment) (Step S205). When the drive voltage Vd is not set to the maximum value, the CPU circuit 13 raises the drive voltage Vd by 0.1 V (Step S206). The CPU circuit 13 subsequently acquires the determination signal output from the comparison circuit 12 (Step S207).

The CPU circuit 13 then determines whether or not the determination signal acquired in Step S207 is the normal signal (Step S208). When the determination signal acquired in Step S207 is the normal signal, the CPU circuit 13 determines that the output error is not occurring in the decoder circuit 11, returns to the process of Step S204, and sets the flag to the corresponding flag address 42.

The CPU circuit 13 repeats the processes of Steps S204 to S208 until the drive voltage Vd is determined to be the maximum value in Step S205 or until the determination signal is not determined to be the normal signal in Step S208.

Figure 13:
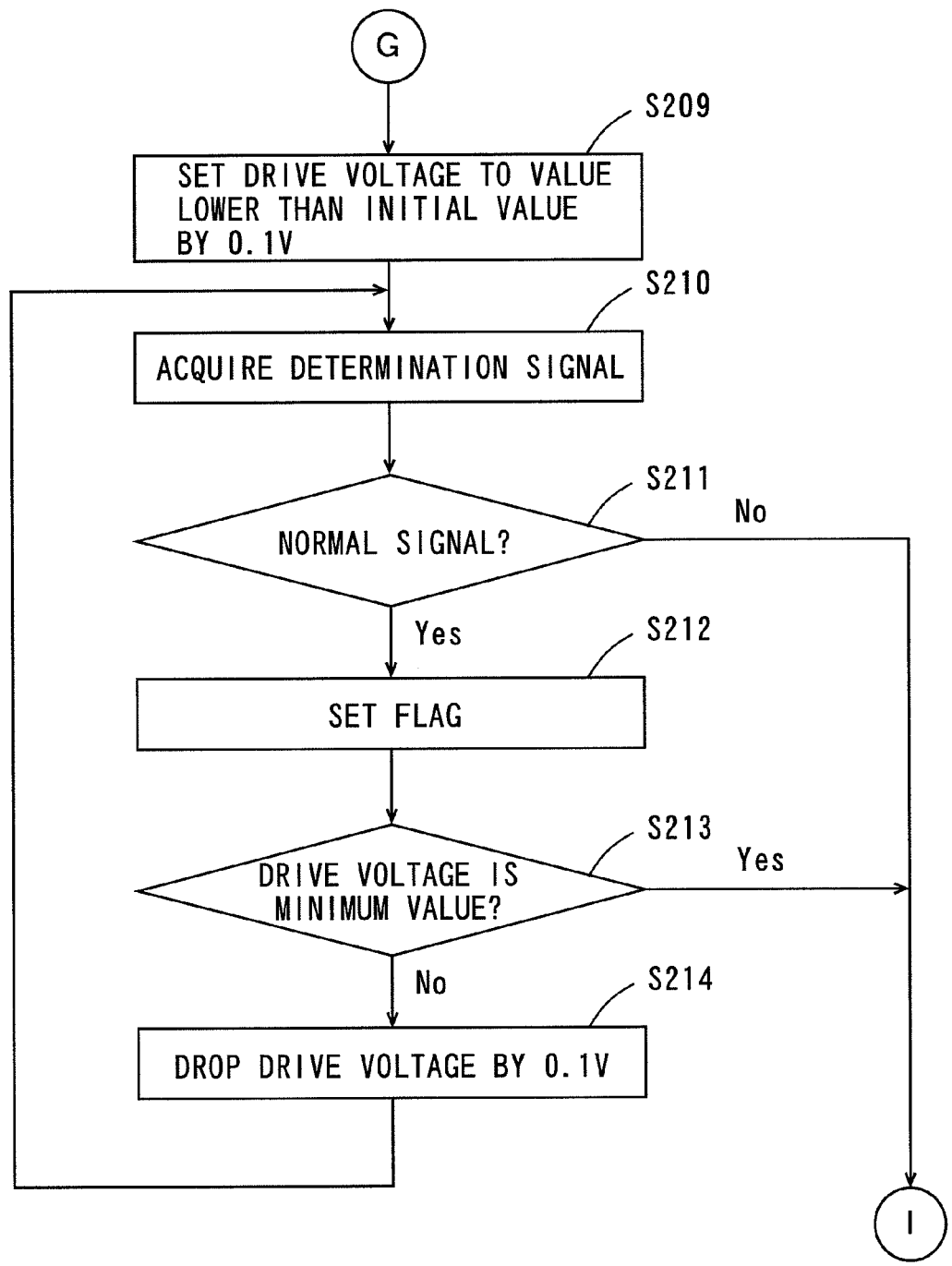
FIG. 13 is a flowchart showing the control operation of the CPU circuit in the second output determination processing.

When the drive voltage Vd is determined to be the maximum value in Step S205, or when the determination signal is not determined to be the normal signal in Step S208, the CPU circuit 13 sets the drive voltage Vd to a value lower than the initial value by 0.1 V (1.7 V in the present embodiment) as shown in FIG. 13 (Step S209).

Then, the CPU circuit 13 acquires the determination signal output from the comparison circuit 12 (Step S210). The CPU circuit 13 subsequently determines whether or not the determination signal acquired in Step S210 is the normal signal (Step S211). When the determination signal acquired in Step S210 is the normal signal, the CPU circuit 13 determines that the output error is not occurring in the decoder circuit 11, and sets the flag to the corresponding flag address 42 (Step S212).

The CPU circuit 13 subsequently determines whether or not the drive voltage Vd supplied from the voltage adjustment circuit 212 is set to the minimum value (1.5 V in the present embodiment) (Step S213). When the drive voltage Vd is not set to the minimum value, the CPU circuit 13 drops the drive voltage Vd by 0.1 V (Step S214). The CPU circuit 13 then returns to the process of Step S210.

The CPU circuit 13 repeats the processes of Steps S210 to S214 until the determination signal is not determined to be the normal signal in Step S211 or until the drive voltage Vd is determined to be the minimum value in Step S213.

Figure 14:
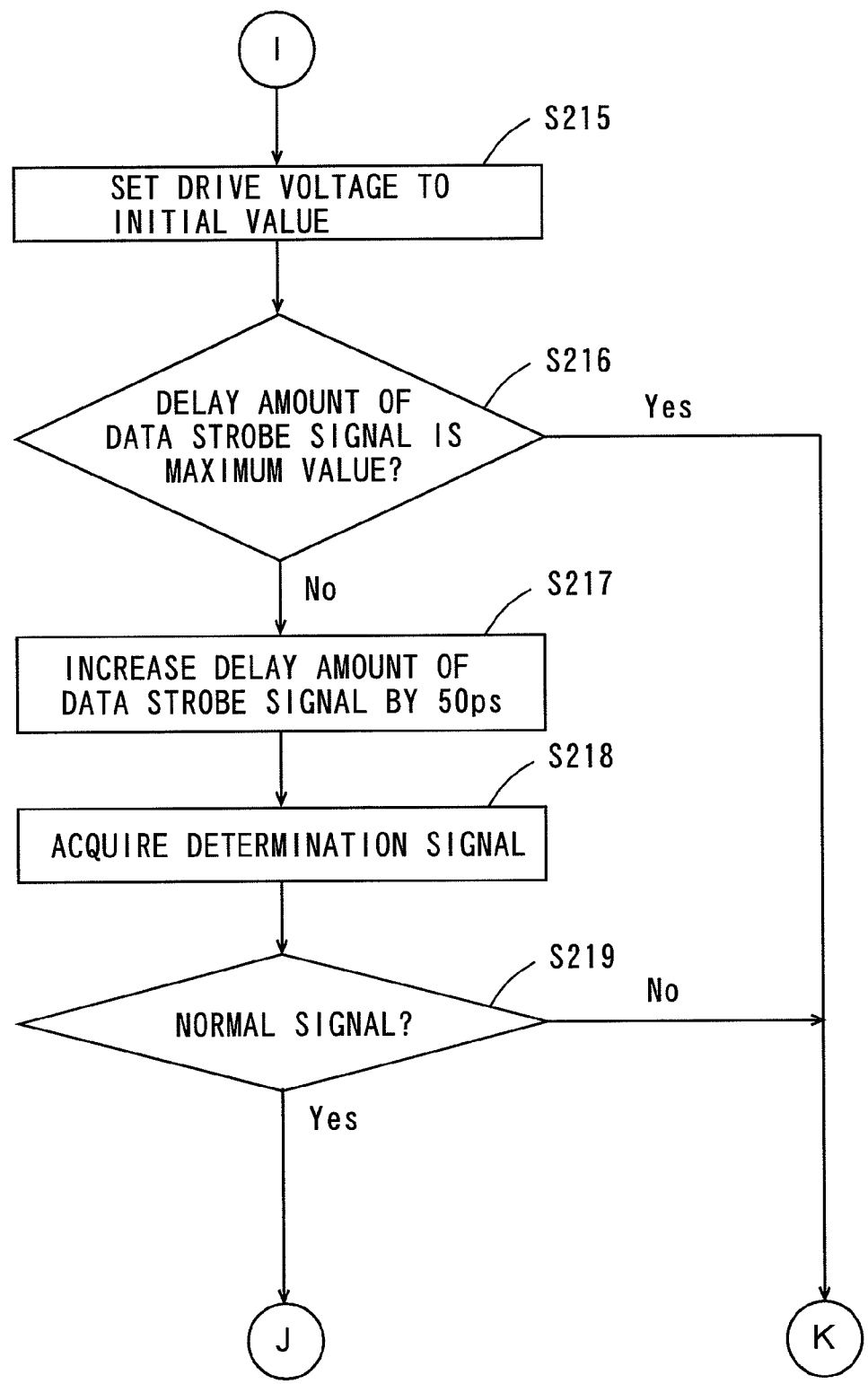
FIG. 14 is a flowchart showing the control operation of the CPU circuit in the second output determination processing.

When the determination signal is not determined to be the normal signal in Step S211, or when the drive voltage Vd is determined to be the minimum value in Step S213, the CPU circuit 13 sets the drive voltage Vd to the initial value as shown in FIG. 14 (Step S215).

Next, the CPU circuit 13 determines whether or not the delay amount of the data strobe signal DQS in the DQS adjustment circuit 18 is the maximum value (+300 ps in the present embodiment) (Step S216). When the delay amount of the data strobe signal DQS in the DQS adjustment circuit 18 is not the maximum value, the CPU circuit 13 increases the delay amount of the data strobe signal DQS in the DQS adjustment circuit 18 by 50 ps (Step S217).

The CPU circuit 13 then acquires the determination signal output from the comparison circuit 12 (Step S218). The CPU circuit 13 subsequently determines whether or not the determination signal acquired in Step S218 is the normal signal (Step S219). When the determination signal acquired in Step S218 is the normal signal, the CPU circuit 13 determines that the output error is not occurring in the decoder circuit 11 to return to the process of Step S204 of FIG. 12 and set the flag to the corresponding flag address 42.

The CPU circuit 13 repeats the processes of Steps S204 to S219 of FIGS. 12 to 14 until the delay amount of the data strobe signal DQS is determined to be the maximum value in Step S216 or until the determination signal is not determined to be the normal signal in Step S219.

Figure 15:
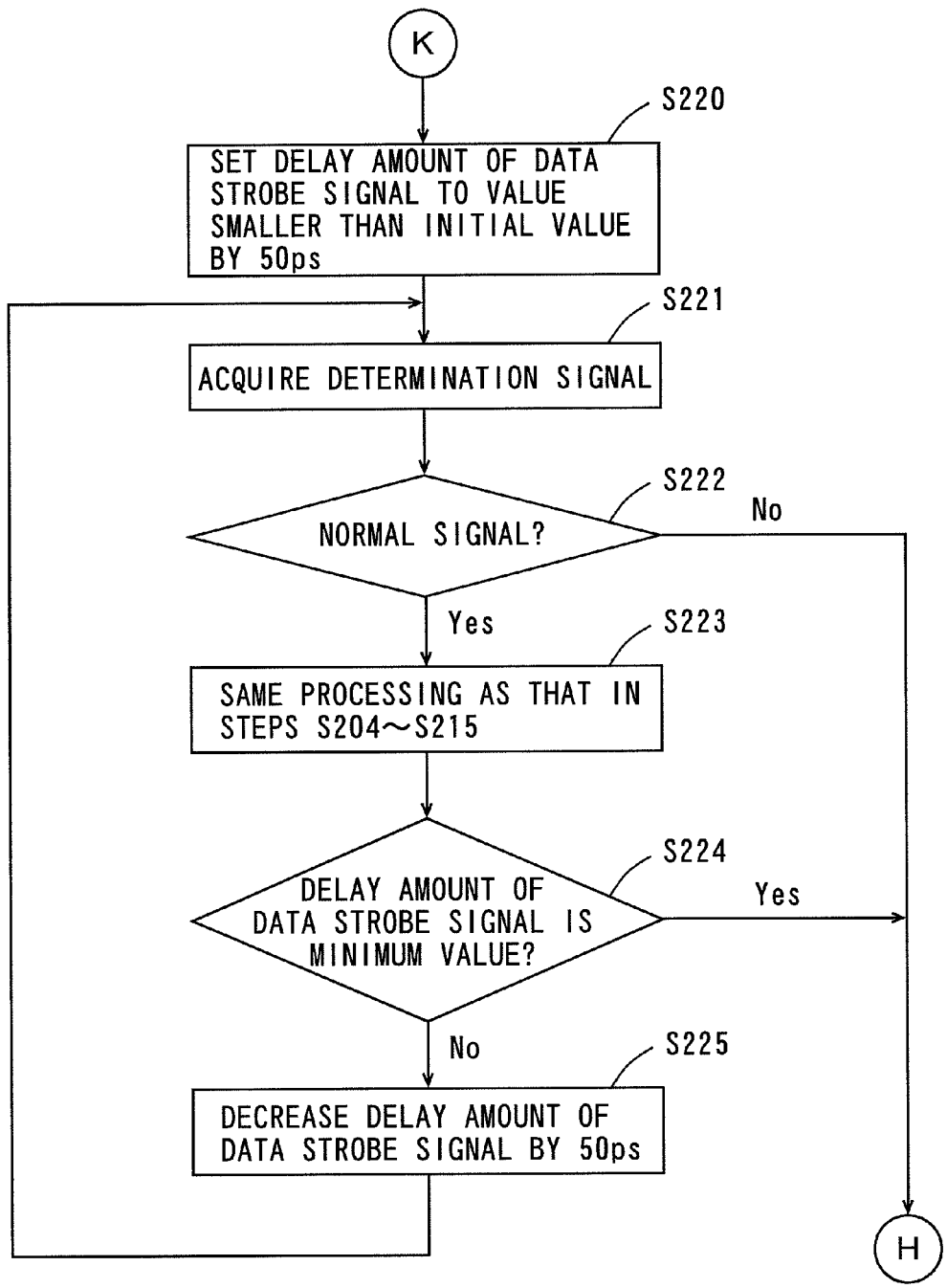
FIG. 15 is a flowchart showing the control operation of the CPU circuit in the second output determination processing.

When the delay amount of the data strobe signal DQS is determined to be the maximum value in Step S216 of FIG. 14 or when the determination signal is not determined to be the normal signal in Step S219, the CPU circuit 13 sets the delay amount of the data strobe signal DQS in the DQS adjustment circuit 18 to a value smaller than the initial value by 50 ps, that is, −50 ps as shown in FIG. 15 (Step S220).

The CPU circuit 13 then acquires the determination signal output from the comparison circuit 12 (Step S221), and determines whether or not the determination signal acquired in Step S221 is the normal signal (Step S222). When the determination signal acquired in Step S221 is the normal signal, the CPU circuit 13 performs the same processing as that in Steps S204 to S215 described referring to FIGS. 12 to 14 (Step S223).

Next, the CPU circuit 13 determines whether or not the delay amount of the data strobe signal DQS in the DQS adjustment circuit 18 is the minimum value (−100 ps in the present embodiment) (Step S224). When the delay amount of the data strobe signal DQS is not the minimum value, the CPU circuit 13 decreases the delay amount of the data strobe signal DQS in the DQS adjustment circuit 18 by 50 ps (Step S225). Then, the CPU circuit 13 returns to the process of Step S221.

The CPU circuit 13 repeats the processes of Steps S221 to S225 until the determination signal is not determined to be the normal signal in Step S222 or until the delay amount of the data strobe signal DQS is determined to be the minimum value in Step S224.

Figure 16:
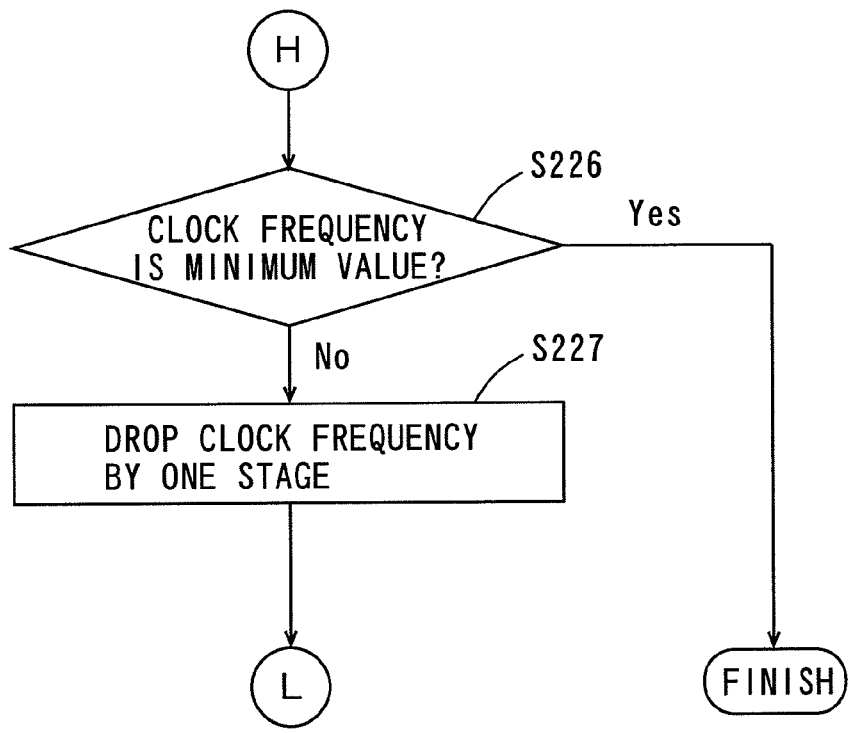
FIG. 16 is a flowchart showing the control operation of the CPU circuit in the second output determination processing.

When the determination signal is not determined to be the normal signal in Step S222, or when the delay amount of the data strobe signal DQS is determined to be the minimum value in Step S224, the CPU circuit 13 determines that derivation of the second determination information is finished in the current clock frequency, and determines whether or not the clock frequency is set to the minimum value (667 MHz in the present embodiment) in the frequency adjustment circuit 15 as shown in FIG. 16 (Step S226).

When the clock frequency is not the minimum value, the CPU circuit 13 drops the clock frequency by one stage (Step S227). When the clock frequency is 800 MHz in Step S226, for example, the CPU circuit 13 sets the clock frequency to 720 MHz in Step S227, and then returns to the process of Step S202 of FIG. 12.

When the determination signal is not determined to be the normal signal in Step S203 of FIG. 12, the CPU circuit 13 determines that the output error is occurring in the decoder circuit 11, and proceeds to the process of Step S226 of FIG. 16 without setting the flag to the flag address 42.

When the clock frequency is determined to be the minimum value in Step S226 of FIG. 16, the CPU circuit 13 finishes the second output determination processing. Accordingly, the second determination information indicated by the states of the flags is stored for each frequency in the matrix memory 204.

(4-3) The Frequency Selection Processing (a) Storage Region

In the frequency selection processing (Step S3 of FIG. 4), the CPU circuit 13 selects the appropriate clock frequency for properly operating the system LSI 209 and the external memory 210 (the system board 200) based on the first and second determination information indicating the results of the first and second output determination processing, and stores the result of the selection in a predetermined storage region of the margin map memory 205 (FIG. 2) as frequency selection information.

Figure 17:
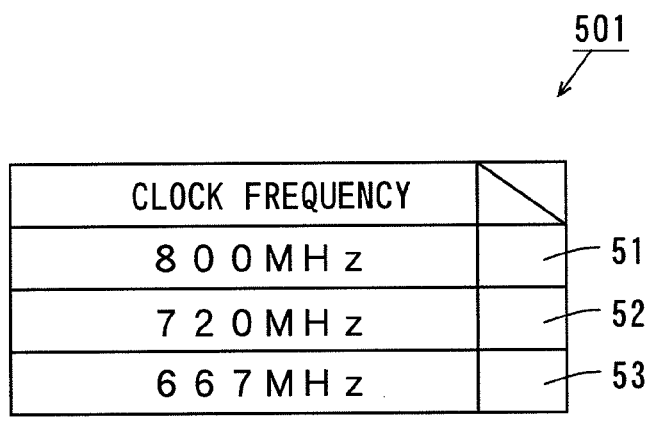
FIG. 17 is a conceptual diagram of a storage region of a margin map memory.

FIG. 17 is a conceptual diagram of a storage region of the margin map memory 205.

As shown in FIG. 17, a storage region 501 of the margin map memory 205 has flag addresses 51, 52, 53 corresponding to the clock frequencies set in the frequency adjustment circuit 15 (FIG. 2), respectively.

For example, the CPU circuit 13 sets flags to the flag addresses 52 and 53 when determining that 720 MHz and 667 MHz are appropriate as the clock frequencies for properly operating the system LSI 209 and the external memory 210.

(b) Control Flow of the CPU Circuit in the Frequency Selection Processing

Hereinafter, detailed description will be made of the control operation of the CPU circuit 13 in the frequency selection processing.

Figure 18:
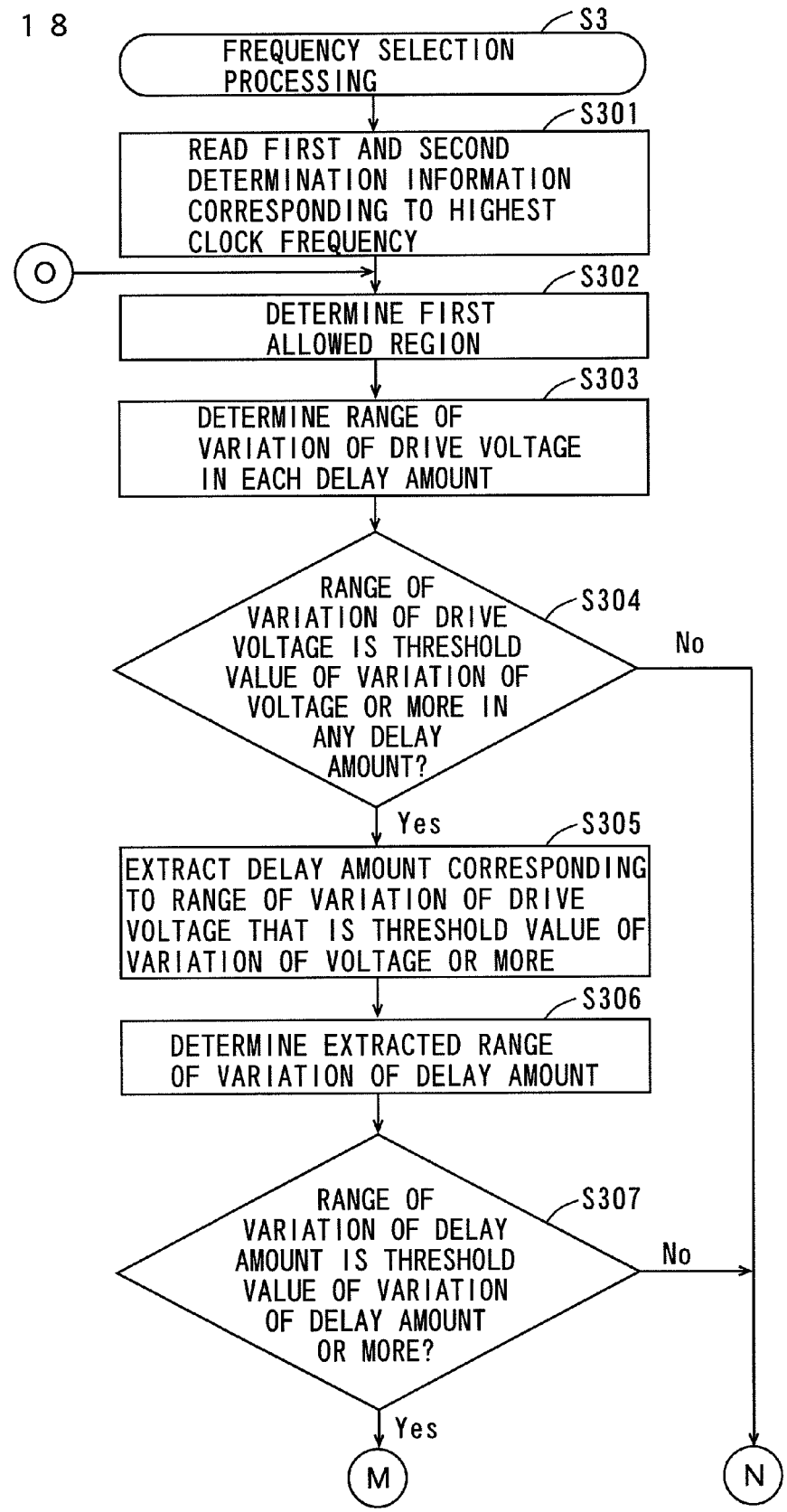
FIG. 18 is a flowchart showing the control operation of the CPU circuit in frequency selection processing.
Figure 19:
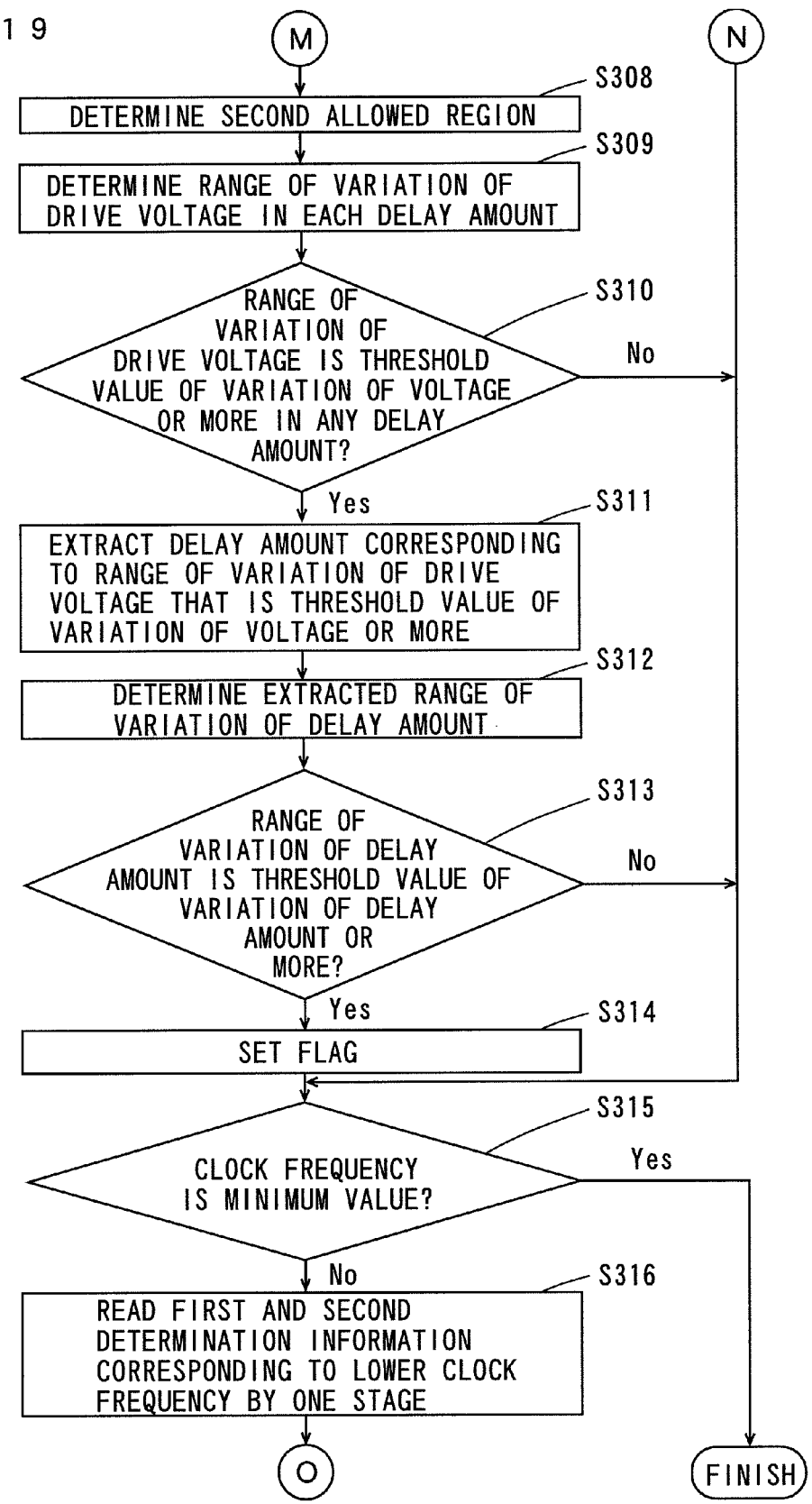
FIG. 19 is a flowchart showing the control operation of the CPU circuit in the frequency selection processing.

FIGS. 18 and 19 are flowcharts showing the control operation of the CPU circuit 13 in the frequency selection processing.

Note that in the following paragraphs, the control flow of FIGS. 18 and 19 is described while referring to one example of the first determination information shown in FIG. 5 and one example of the second determination information shown in FIG. 11 for easier description of the frequency selection processing.

As described above, "○" are shown in the flag addresses 41, 42 to which the flags are set in FIGS. 5 and 11. That is, the output error is not occurring in the decoder circuit 11 in the conditions corresponding to the flag addresses 41, 42 indicated by "○".

In the first determination information, a region that satisfies the conditions of the delay amount of the data signal DQ and the drive voltage Vd (a region to which the flags are set) when the output error is not occurring in the decoder circuit 11 is referred to as a first allowed region. In FIG. 5, a region surrounded by the one-dot and dash line is the first allowed region.

In the second determination information, a region that satisfies the conditions of the delay amount of the data strobe signal DQS and the drive voltage Vd (a region to which the flags are set) when the output error is not occurring in the decoder circuit 11 is referred to as a second allowed region. In FIG. 11, a region surrounded by the one-dot and dash line is the second allowed region.

In description of flowcharts in FIGS. 18 and 19, the delay amount of the data signal DQ and the delay amount of the data strobe signal DQS are abbreviated as the delay amounts for simplicity.

As shown in FIG. 18, first, the CPU circuit 13 reads the first and second determination information corresponding to the highest clock frequency from the matrix memory 204 (Step S301). In the present embodiment, the first determination information in the storage region 401 (FIG. 5) and the second determination information in the storage region 404 (FIG. 11) are read.

Next, the CPU circuit 13 determines the first allowed region based on the first determination information that is currently read (Step S302). Next, the CPU circuit 13 determines a range of variation of the drive voltage Vd in each delay amount of the first allowed region determined in Step S302 (Step S303).

For example, in Step S303, the range of variation of the drive voltage Vd in the delay amount of −150 ps is determined to be 0.1 V, the range of variation of the drive voltage Vd in the delay amount of −100 ps is determined to be 0.2 V, the range of variation of the drive voltage Vd in the delay amount of −50 ps and ±0 ps is determined to be 0.4 V, and the range of variation of the drive voltage Vd in the delay amount of +50 ps is determined to be 0.1 V in the first allowed region determined from the first determination information of the storage region 401 of FIG. 5.

Next, the CPU circuit 13 determines whether or not the range of variation of the drive voltage Vd is a threshold value of variation of the voltage (0.4 V, for example) or more in any delay amount in the first allowed region based on the result of the determination in Step S303 (Step S304). Note that the threshold value of variation of the voltage and a threshold value of variation of the delay amount, described below, are stored in a memory that is not shown, and can be suitably set by a user.

When the range of variation of the drive voltage Vd is determined to be the threshold value of variation of the voltage or more in any delay amount, the CPU circuit 13 extracts the delay amount in which the range of variation of the drive voltage Vd is the threshold value of variation of the voltage or more (Step S305). When the threshold value of variation of the voltage is 0.4 V, for example, the delay amount of ±0 ps and the delay amount of −50 ps are extracted in the first determination information of the storage region 401 of FIG. 5.

Next, the CPU circuit 13 determines the range of variation of the delay amount extracted in Step S305 (Step S306). For example, the range of variation of the delay amount is determined to be 50 ps (=±0 ps-(−50 ps)) in the first determination information of the storage region 401 of FIG. 5.

Note that when the delay amount extracted in Step S305 is successive values, a difference between the maximum value and the minimum value of the successive values is calculated as the range of variation of the delay amount in Step S306. The delay amount is increased/decreased by each 50 ps in the first determination processing in the present embodiment. Therefore, when +50 ps, ±0 ps, −50 ps and −150 ps are extracted as the delay amounts, for example, the successive delay amounts are +50 ps, ±0 ps and −50 ps. In this case, the range of variation of the delay amount determined in Step S306 is 100 ps (=+50 ps-(−50 ps)).

Then, the CPU circuit 13 determines whether or not the range of variation of the delay amount determined in Step S306 is the threshold value of variation of the delay amount (100 ps, for example) or more (Step S307).

When the range of variation of the delay amount is the threshold value of variation of the delay amount or more, the CPU circuit 13 determines the second allowed region based on the second determination information that is currently read as shown in FIG. 19 (Step S308). The CPU circuit 13 subsequently determines the range of variation of the drive voltage Vd in each delay amount of the second allowed region determined in Step S308 (Step S309).

For example, in Step S309, the range of variation of the drive voltage Vd in the delay amount of −50 ps is determined to be 0.1 V, the range of variation of the drive voltage Vd in the delay amounts of ±0 ps and +50 ps is determined to be 0.4 V, the range of variation of the drive voltage Vd in the delay amount of +100 ps is determined to be 0.2 V, and the range of variation of the drive voltage Vd in the delay amount of +150 ps is determined to be 0.1 V in the second allowed region determined from the determination information of the storage region 404 of FIG. 11.

The CPU circuit 13 subsequently determines whether or not the range of variation of the drive voltage Vd is the threshold value of variation of the voltage (0.4 V, for example) or more in any delay amount of the second allowed region based on the result of the determination in Step S309 (Step S310).

When the range of variation of the drive voltage Vd is determined to be the threshold value of variation of the voltage or more in any delay amount, the CPU circuit 13 extracts the delay amount in which the range of variation of the drive voltage Vd is the threshold value of variation of the voltage or more (Step S311). When the threshold value of variation of the voltage is 0.4 V, for example, the delay amount of ±0 ps and the delay amount of +50 ps are extracted in the second determination information of the storage region 404 of FIG. 11.

The CPU circuit then determines the range of variation of the delay amount extracted in Step S311 (Step S312). For example, the range of variation of the delay amount is determined to be 50 ps (=+50 ps-(±0 ps)) in the second determination information of the storage region 404 of FIG. 11. Note that in Step S312, when the delay amounts extracted in Step S311 are successive values, a difference between the maximum value and the minimum value of the successive values is calculated as the range of variation of the delay amount similarly to Step S306 (FIG. 18).

Next, the CPU circuit 13 determines whether or not the range of variation of the delay amount determined in Step S312 is the threshold value of variation of the delay amount or more (Step S313).

When the range of variation of the delay amount is the threshold value of variation of the delay amount or more, the CPU circuit 13 determines that the clock frequency corresponding to the first and second determination information that is currently read is appropriate as the clock frequency for properly operating the system LSI 209 and the external memory 210, and sets the flag to the corresponding flag address (any of the flag addresses 51, 52, 53) of the storage region 501 (FIG. 17) (Step S314).

Next, the CPU circuit 13 determines whether or not the clock frequency corresponding to the first and second determination information that is currently read is the minimum value (667 MHz in the present embodiment) (Step S315).

When the clock frequency is not the minimum value, the CPU circuit 13 reads from the matrix memory 204 the first and second determination information corresponding to a clock frequency lower by one stage than the clock frequency corresponding to the first and second determination information that is currently read (Step S316). When the clock frequency corresponding to the first and second determination information that is currently read in Step S315 is determined to be 800 MHz, the CPU circuit 13 reads the first and second determination information corresponding to the clock frequency of 720 MHz from the matrix memory 204, for example, in the present embodiment. Then, the CPU circuit 13 returns to the process of Step S302, and performs the foregoing processing to the first and second determination information that is being read.

When the range of variation of the drive voltage Vd is not determined to be the threshold value of variation of the voltage or more in Step S304 of FIG. 18 or Step S310 of FIG. 19, or when the range of variation of the delay amount is not determined to be the threshold value of variation of the delay amount or more in Step S307 of FIG. 18 or Step S313 of FIG. 19, the CPU circuit 13 proceeds to Step S315 of FIG. 19 without setting the flag, and determines whether or not the clock frequency corresponding to the first and second determination information that is currently read is the minimum value.

When the clock frequency is determined to be the minimum value in Step S315 of FIG. 19, the CPU circuit 13 finishes the frequency selection processing. This causes the frequency selection information for each frequency indicated by the states of the flags is stored in the storage region 501 (FIG. 17) of the margin map memory 205 (FIG. 2).

Note that when the first and second determination information of the storage regions 401 to 406 shown in FIGS. 5 and 11 are processed according to the foregoing control flow while the threshold value of variation of the voltage is set to 4.0 V and the threshold value of variation of the delay amount is set to 100 ps, the clock frequencies of 720 MHz and 667 MHz are determined to be appropriate as the clock frequencies for properly operating the system LSI 209 and the external memory 210. In this case, the CPU circuit 13 sets the flags to the flag address 52 and the flag address 53 of the storage region 501 of the margin map memory 205.

(4-4) The Optimum Value Determination Processing

In the optimum value determination processing (Step S4 of FIG. 4), the CPU circuit 13 determines the maximum values of the appropriate drive voltage Vd and clock frequency at which the system LSI 209 and the external memory 210 can be properly operated based on the first and second determination information and the frequency selection information. Then, the CPU circuit 13 stores the determined maximum values of the drive voltage Vd and the clock frequency in the drive voltage grade memory 207 (FIG. 2) and the speed grade memory 206 (FIG. 2), respectively.

Detailed description will be made of the control operation of the CPU circuit in the optimum value determination processing.

Figure 20:
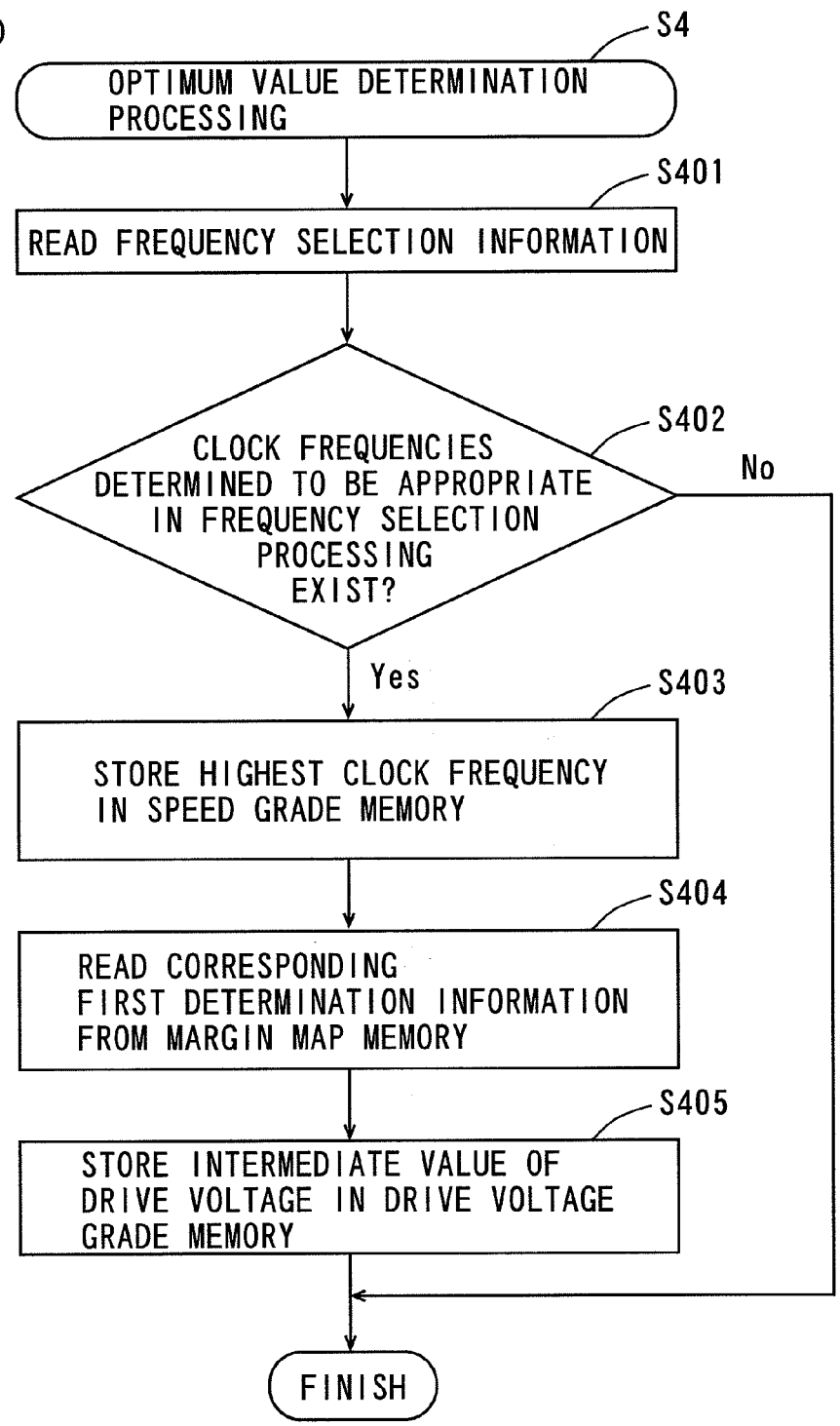
FIG. 20 is a flowchart showing the control operation of the CPU circuit in optimum value determination processing.

FIG. 20 is a flowchart showing the control operation of the CPU circuit 13 in the optimum value determination processing.

As shown in FIG. 20, the CPU circuit 13 first reads the frequency selection information from the storage region 501 (FIG. 17) of the margin map memory 205 (FIG. 2) (Step S401).

Next, the CPU circuit 13 determines whether or not the clock frequencies determined to be appropriate in the frequency selection processing (Step S3 of FIG. 4) exist based on the frequency selection information read in Step S401 (Step S402). When the clock frequencies determined to be appropriate exist, the CPU circuit 13 stores the highest clock frequency in the speed grade memory 206 (Step S403).

Next, the CPU circuit 13 reads from the matrix memory 204 the first determination information (or the second determination information) corresponding to the clock frequency stored in the speed grade memory 206 (FIG. 2) (Step S404).

The CPU circuit 13 then calculates an intermediate value of the drive voltage Vd based on the first determination information (or the second determination information) read in Step S404, and stores the calculated intermediate value in the drive voltage grade memory 207 (Step S405). In this manner, the optimum value determination processing is finished.

Note that the intermediate value between the maximum value and the minimum value of the drive voltage Vd is calculated in the delay amount in which the range of variation of the drive voltage Vd in the first or second allowed range (the range indicated by the one-dot and dash line in FIG. 5 or 11) is maximized in Step S405. For example, the range of variation of the drive voltage Vd is maximized (0.6 V) when the delay amount of the data signal DQ is ±0 ps, −50 ps or −100 ps in the storage region 403 of FIG. 5. In this case, the CPU circuit 13 calculates 1.8 V (=(2.1 V+1.5 V)/2) as the intermediate value.

When it is determined that the clock frequency determined to be appropriate does not exist in Step S402, the CPU circuit 13 finishes the optimum value determination processing without storing the clock frequency and the intermediate value in the speed grade memory 206 and the drive voltage grade memory 207.

Note that the data stored in the margin map memory 205, the speed grade memory 206 and the drive voltage grade memory 207 is read by an external apparatus via the read interface 208.

(5) Effects of the Present Embodiment

As described above, the CPU circuit 13 detects the presence/absence of the output error in the decoder circuit 11 while varying the setup period Ts and the drive voltage Vd in the memory controller 16 and the external memory 210 in the operation guarantee system according to the present embodiment. Moreover, the CPU circuit 13 determines an operation margin (the first and second allowed regions) of the system board 200 (the system LSI 209 and the external memory 210) based on the result of the detection. Then, the CPU circuit 13 determines the clock frequency and the drive voltage Vd at which the appropriate operation margin of the system board 200 is obtained based on the result of the determination.

In this case, the system board 200 is operated based on the determined clock frequency and drive voltage Vd to prevent the occurrence of the output error in the system board 200.

The determined clock frequency is read from the margin map memory 205 and the speed grade memory 206 by the external apparatus. Thus, a plurality of system boards 200 that have been manufactured can be classified by the determined clock frequencies in a manufacturing location of the system boards. In this case, an appropriate system board 200 can be selected from the plurality of system boards 200 classified by the clock frequencies according to a use environment, performance and so on of the television receiver 1000. As a result, the operation of the television receiver 1000 can be appropriately guaranteed. For example, the system board 200 of a high clock frequency can be selected to be used in a high-definition television receiver 1000 having relatively high performance, and the system board 200 of a low clock frequency can be selected to be used in a non-high-definition-compliant television receiver 1000 not having relatively high performance.

The determined drive voltage Vd is read from the drive voltage grade memory 207 by the external apparatus. Accordingly, the plurality of system boards 200 that have been manufactured can be classified by the determined drive voltages Vd in the manufacturing location of the system boards 200. In this case, a more appropriate system board 200 can be selected from the plurality of system boards 200 classified by the drive voltages Vd according to the use environment, performance and so on of the television receiver 1000. As a result, the operation of the television receiver 1000 can be more appropriately guaranteed. For example, the system board 200 with a low power supply voltage can be selected to be used in a mobile television receiver 1000 of a battery powered type, and the system board 200 with a high power supply voltage can be selected to be used in a fixed television receiver 1000 of an AC power supply driven type.

In addition, the system board 200 can be appropriately selected according to the use environment, performance and so on of the television receiver 1000 as described above, so that a malfunction of the television receiver 1000 can be reliably prevented and the manufacturing cost of the television receiver 1000 can be reduced.

Moreover, the threshold value of variation of the delay amount is suitably set according to the use environment, performance and so on of the television receiver 1000, so that the system board 200 having the appropriate operation margin can be easily manufactured.

(6) Other Embodiments (a) Other Examples of the External Memory

While description is made of the case where a DDR-SDRAM is used as the external memory 210 in the foregoing embodiment, the present invention is not limited to the DDR-SDRAM and is applicable to another memory.

For example, another memory such as a SDRAM (Synchronous Dynamic Random Access Memory), a DDR2-SDRAM, a DDR3-SDRAM may be used as the external memory 210.

Note that when the SDRAM is used as the external memory 210, the same processing as the first and second output determination processing (FIG. 4) may be performed by varying a delay period between the data signal DQ and the clock signal CLK.

When the DDR2-SDRAM or the DDR3-SDRAM is used as the external memory 210, the same processing as the first and second output determination processing may be performed by varying a delay period between an intersection of data strobe signals DQS,/DQS (an intersection time point of the rising edge and the dropping edge) and the time point at which the data signal DQ varies.

(b) Other Examples of the Control of the DQ Adjustment Circuit and the DQS Adjustment Circuit While the DQ adjustment circuit 17 (FIG. 2) or the DQS adjustment circuit 18 (FIG. 2) are controlled such that the setup period Ts varies in the range from 0 ps to 400 ps in the first and second output determination processing in the foregoing embodiment, the range of variation of the setup period Ts is not limited to the foregoing example. For example, the DQ adjustment circuit 17 or the DQS adjustment circuit 18 may be controlled such that the setup period Ts varies to a range of 400 ps or more.

While the delay amount of the data signal DQ caused by the DQ adjustment circuit 17 is varied by each 50 ps in the first output determination processing in the foregoing embodiment, the variation of the delay amount of the data signal DQ is not limited to 50 ps. For example, the delay amount of the data signal DQ may be varied by each 10 ps or each 5 ps. Similarly, the delay amount of the data strobe signal DQS may be varied by each 10 ps or each 5 ps in the second output determination processing.

While the DQ adjustment circuit 17 adjusts the delay amount of the data signal DQ input to the external memory 210 to adjust the setup period Ts in the external memory 210 in the foregoing embodiment, the DQS adjustment circuit 18 may adjust the delay amount of the data strobe signal DQS input to the external memory 210 to adjust the setup period Ts in the external memory 210.

While the DQS adjustment circuit 18 adjusts the delay amount of the data strobe signal DQS input to the memory controller 16 to adjust the setup period Ts in the memory controller 16 in the foregoing embodiment, the DQ adjustment circuit 17 may adjust the delay amount of the data signal DQ input to the memory controller 16 to adjust the setup period Ts in the memory controller 16.

(c) Other Examples of the Control of the Voltage Adjustment Circuit

While the voltage adjustment circuit 212 (FIG. 2) is controlled such that the drive voltage Vd varies in the range from 1.5 V to 2.1 V in the first and second output determination processing in the foregoing embodiment, the range of variation of the drive voltage Vd is not limited to the foregoing example. Preferably, the range of variation is suitably changed according to the external memory 210 to be used. For example, the voltage adjustment circuit 212 may be controlled such that the drive voltage Vd varies to a range of 1.5 V or lower, and may be controlled such that the drive voltage Vd varies to a range of 2.1 V or higher.

While the voltage adjustment circuit 212 (FIG. 2) is controlled such that the drive voltage Vd varies by each 0.1 V in the first and second output determination processing in the foregoing embodiment, the variation of the drive voltage Vd by the voltage adjustment circuit 212 is not limited to 0.1 V. For example, the drive voltage Vd may be varied by each 0.2 V.

(d) Other Examples of the Threshold Value of Variation of the Voltage and the Threshold Value of Variation of the Delay Amount While description is made of the case where the threshold value of variation of the voltage is 0.4 V and the threshold value of variation of the delay amount is 100 ps in the foregoing embodiment, the threshold value of variation of the voltage and the threshold value of variation of the delay amount are not limited to the foregoing examples.

For example, the threshold value of variation of the voltage may be 0.1 V and the threshold value of variation of the delay amount may be 300 ps. The threshold value of variation of the voltage may be 0.2 V, and the threshold value of variation of the delay amount may be 500 ps. The threshold value of variation of the voltage may be 0.3 V, and the threshold value of variation of the delay amount may be 700 ps.

(e) Other Examples of the Clock Frequency

While the frequency adjustment circuit 15 is controlled such that the clock frequency is adjusted to 667 MHz, 720 MHz and 800 MHz in the foregoing embodiment, the values of the clock frequency are not limited to the foregoing examples. Preferably, the values of the clock efficiency are suitably changed according to the external memory 210 to be used. For example, the clock frequency may be adjusted to a value of 667 MHz or lower, and may be adjusted to a value of 800 MHz or higher.

While the appropriate clock frequency is selected based on the plurality of operating conditions of the external memory 210 and the memory controller 16 (the range of variation of the drive voltage Vd, the delay amount of the data signal DQ and the delay amount of the data strobe signal DQS) in the foregoing embodiment, the method of selecting the appropriate clock frequency is not limited to the foregoing example. The first and second allowed regions may be determined based on one operating condition.

For example, when the range of variation of the drive voltage Vd is the threshold value of variation of the voltage or more, the clock frequency at this time may be determined to be the appropriate clock frequency. In addition, when the range of variation of the delay amount of the data signal DQ or the data strobe signal DQS is the threshold value of variation of the delay amount or more, the clock frequency at this time may be determined to be the appropriate clock frequency, for example.

Furthermore, the appropriate clock frequency may be selected based on other operating conditions such as a temperature.

(f) Other Examples of the Optimum Value Determination Processing

While the highest clock frequency is stored in the speed grade memory 206 in the process of Step S403 (FIG. 20) of the optimum value determination processing in the foregoing embodiment, the lowest clock frequency or the clock frequency of the intermediate value may be stored in the speed grade memory 206 in the process of Step S403. In this case, since the operation margin of the system board 200 can be sufficiently obtained, the operation of the system board 200 can be more appropriately guaranteed.

(g) Other Examples of the Speed Grade Memory

While the storage region 501 (FIG. 17) for storing the result of the selection in the frequency selection processing (Step S3 of FIG. 4) is provided in the margin map memory 205 in the foregoing embodiment, the storage region 501 may be provided in the speed grade memory 206. In this case, the margin map memory 205 need not be provided, so that the circuit configuration of the system board 200 is further simplified.

(h) Other Examples of the Test Data Signal

While the decoder circuit 11 outputs the test data signal decoded from the encoded test signal input from the test data interface 202 to the comparison circuit 12 in the foregoing embodiment, the digital video signal decoded from the transport stream input from the NIM 201 may be output to the comparison circuit 12 as the test data signal.

(7) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiment, the decoder circuit 11 and the CPU circuit 13 are examples of a signal processing circuit, the external memory 210 is an example of a first storage circuit, the comparison circuit 12 is an example of a detection circuit, the threshold value of variation of the voltage is an example of a first threshold value, the threshold value of variation of the delay amount is an example of a second threshold value, the CPU circuit 13 is an example of a determiner, the speed grade memory 206 is an example of a second storage circuit, the memory controller 16 is an example of an auxiliary circuit, the clock signal CLK or the data strobe signal DQS is an example of a first reference signal, the data strobe signal DQS is an example of a second reference signal, the setup period Ts is an example of first and second delay amounts, the voltage adjustment circuit 212 is an example of a drive voltage supply circuit, the drive voltage grade memory 207 is an example of a third storage circuit, the frequency adjustment circuit 15, the DQ adjustment circuit 17, the DQS adjustment circuit 18 or the voltage adjustment circuit 212 are examples of an adjustment circuit.

As each of various elements recited in the claims, various other elements having configurations or functions described in the claims can be also used.

INDUSTRIAL APPLICABILITY

The present invention can be effectively utilized in various electric apparatuses and electronic apparatuses.

The invention claimed is:

1. An operation guarantee system comprising:
a signal processing circuit that processes a signal;
a first storage circuit that is operated based on first and second operating conditions and stores a data signal output from said signal processing circuit at the time of signal processing in said signal processing circuit;
an auxiliary circuit that outputs a clock signal to said first storage circuit and perfoims processing for writing and reading said data signal between said signal processing circuit and said first storage circuit;
an adjustment circuit that adjusts the second operating condition of said first storage circuit to different values;
a detection circuit that detects the presence or absence of an output error in said signal processing circuit;
a determiner that determines a range of variation of a value of said second operating condition in a state where said output error is not detected from said detection circuit as a first allowed range of variation, and determines whether or not said first allowed range of variation is a first threshold value or more; and
a second storage circuit that stores the values of said second operating condition, wherein
said determiner determines said first allowed range of variation in said first operating condition as an allowed margin when said first allowed range of variation is determined to be the first threshold value or more, and stores, in said second storage circuit, at least one value out of the values of said second operating condition in the state where said output error is not detected,
said first storage circuit outputs, to said auxiliary circuit, the data signal and a first reference signal as a reference of an acquisition timing of the data signal in said auxiliary circuit,
said first operating condition includes a frequency of said clock signal, and
said second operating condition includes a first delay amount between said data signal input to said auxiliary circuit and said first reference signal.

2. The operation guarantee system according to claim 1, wherein
said auxiliary circuit outputs to said first storage circuit a second reference signal as a reference of an acquisition timing of said data signal in said first storage circuit, and
said second operating condition further includes a second delay amount between said data signal input to said first storage circuit and said second reference signal.

3. The operation guarantee system according to claim 1, further comprising
a drive voltage supply circuit that supplies a drive voltage to said first storage circuit, wherein
said second operating condition further includes said drive voltage.

4. The operation guarantee system according to claim 1, wherein
said first storage circuit is further operated based on a third operating condition,
said adjustment circuit adjusts the second operating condition to the different values, and adjusts said third operating condition of said first storage circuit to different values for each value of the second operating condition,
said determiner determines a range of variation of the value of said third operating condition as a second allowed range of variation for each value of the second operating condition adjusted by said adjustment circuit, determines said first allowed range of variation in a state where said second allowed range of variation is a second threshold value or more, determines whether or not said first allowed range of variation is the first threshold value or more, and does not determine that said first operating condition is appropriate when said first allowed range of variation is not determined to be the first threshold value or more.

5. The operation guarantee system according to claim 4, further comprising
a drive voltage supply circuit that supplies a drive voltage to said first storage circuit, wherein
said third operating condition includes said drive voltage.

6. The operation guarantee system according to claim 5, wherein
when said first allowed range of variation is determined to be the first threshold value or more, said determiner calculates an intermediate value between a maximum value and a minimum value of said drive voltage in the first delay amount with which said second allowed range of variation is maximized.

* * * * *